(12) United States Patent
Kobayashi

(10) Patent No.: US 7,172,981 B2
(45) Date of Patent: Feb. 6, 2007

(54) SEMICONDUCTOR INTEGRATED CIRCUIT DEVICE MANUFACTURING METHOD INCLUDING STATIC CHARGE ELIMINATION

(75) Inventor: Yoshiaki Kobayashi, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 71 days.

(21) Appl. No.: 10/932,237

(22) Filed: Sep. 2, 2004

(65) Prior Publication Data

US 2005/0022840 A1 Feb. 3, 2005

Related U.S. Application Data

(63) Continuation of application No. 09/941,835, filed on Aug. 30, 2001, now abandoned.

(30) Foreign Application Priority Data

Oct. 12, 2000 (JP) .............................. 2000-311480

(51) Int. Cl.
*H01L 21/02* (2006.01)
*H01L 21/67* (2006.01)

(52) U.S. Cl. ...................... 438/800; 438/909; 438/758; 206/712; 134/1.3

(58) Field of Classification Search ................ 206/711, 206/710; 414/935–940, 941; 134/1.2, 1.3; 438/800, 908, 909, 758
See application file for complete search history.

(56) References Cited

U.S. PATENT DOCUMENTS

| 4,657,617 | A | | 4/1987 | Johnson et al. |
| 4,657,621 | A | | 4/1987 | Johnson et al. |
| 5,440,575 | A | | 8/1995 | Chand et al. |
| 5,492,862 | A | * | 2/1996 | Misumi ....................... 438/516 |
| 5,759,006 | A | | 6/1998 | Miyamoto et al. |
| 6,010,008 | A | * | 1/2000 | Nyseth et al. ............... 206/711 |
| 6,124,210 | A | * | 9/2000 | Chino et al. ................. 438/706 |
| 6,256,825 | B1 | | 7/2001 | Hwang |
| 6,846,149 | B2 | * | 1/2005 | Savage et al. ......... 414/416.03 |
| 6,890,853 | B2 | * | 5/2005 | Biberger et al. ............ 438/670 |

(Continued)

FOREIGN PATENT DOCUMENTS

JP 6310083 11/1994

(Continued)

OTHER PUBLICATIONS

Full English language translation of JP 2002-009131 (Jan. 11, 2002); pp. 1-48.

(Continued)

*Primary Examiner*—M. Wilczewski
*Assistant Examiner*—Seth Barnes
(74) *Attorney, Agent, or Firm*—Antonelli, Terry, Stout and Kraus, LLP.

(57) ABSTRACT

A sealed type container accommodating a semiconductor substrate is positioned to a load port of a semiconductor manufacturing apparatus. The semiconductor substrate is taken out of the container. An ionizer is used for static-charge-eliminating the semiconductor substrates before and after process treatment in a transport area between the load port and a treatment section. The static-charge-eliminated semiconductor substrate is accommodated in the container positioned to the load port. Thus, it is possible to decrease foreign materials adhering to the semiconductor substrate and errors in handling the semiconductor substrate.

14 Claims, 12 Drawing Sheets

U.S. PATENT DOCUMENTS 6,967,174 B1 * 11/2005 Mayer et al. ............... 438/748

FOREIGN PATENT DOCUMENTS

| JP | 714761 | 1/1995 |
| JP | 07-321177 | 12/1995 |
| JP | 88319 | 1/1996 |
| JP | 9102444 | 4/1997 |
| JP | 9223673 | 8/1997 |
| JP | 09-283597 | 10/1997 |
| JP | 10-070185 | 3/1998 |
| JP | 10-084034 | 3/1998 |
| JP | 2000114349 | 4/2000 |
| JP | 2000-164688 | 6/2000 |
| JP | 200144089 | 2/2001 |
| JP | 20029131 | 1/2002 |
| WO | WO 00/03056 | 1/2000 |

OTHER PUBLICATIONS

Full English language translation of JP 2001-044089 (Feb. 16, 2001); pp. 1-39.
Full English language translation of JP 08-008319 (Jan. 12, 1996); pp. 1-34.
Full English language translation of JP 09-102444 (Apr. 15, 1997); pp. 1-17.
Full English language translation of JP 06-310083 (Nov. 4, 1994); pp. 1-21.
Full English language translation of JP 2000-114349 (Apr. 21, 2000); pp. 1-22.

* cited by examiner

US 7,172,981 B2

SEMICONDUCTOR INTEGRATED CIRCUIT DEVICE MANUFACTURING METHOD INCLUDING STATIC CHARGE ELIMINATION

This application is a Continuation application of application Ser. No. 09/941,835, filed Aug. 30, 2001 now abandoned, the contents of which are incorporated herein by reference in their entirety.

BACKGROUND OF THE INVENTION

The present invention relates to a technique for manufacturing a semiconductor integrated circuit device. More specifically, the present invention relates to a technique effectively applied to a static elimination technique of a semiconductor substrate and an accommodating technique of a closed type.

For example, as methods of static-eliminating the substrate, techniques thereof are disclosed in Japanese Patent Laid-open No. 8-8319, No. 7-14761 and No. 9-223673.

First, according to a technique disclosed in Japanese Patent Laid-open No. 8-8319, air is ionized by using an antistatic or static-elimination mechanism such as an ionized air generator, and the ionized air is blown on a substrate, thereby antistatic or static-elimination of the substrate is carried out, so that trouble such as miss transportation of substrates, or the like is prevented.

According to the technique disclosed in Japanese Patent Laid-open No. 7-14761, under the state that non-reactive gas is filled in a case in which an electrically charged substrate is put, electric charges of the electrically charged substrate are neutralized by generating ions and electrons in the case, and thereby complete annihilation of electromagnetic noise free, contamination free and residual potential can be achieved.

According to the technique disclosed in Japanese Patent Laid-open No. 9-223673, a transport apparatus is described which is capable of transporting a semiconductor substrate into a reactor that grows a predetermined semiconductor layer, without bringing out the semiconductor substrate outside the system thereof. Ion of predetermined gas is generated in predetermined atmosphere and thereby a semiconductor substrate in the transport apparatus is static-eliminated.

With respect to a clean room for performing manufacturing processes or the like of a semiconductor substrate, for example, the associated technology is described in pp. 16–21 of "Electronic Materials, August Issue" published on 1 Aug., 2000 by Kogyo Chosakai Co., Ltd. This issue reports a clean room structure including mini-Environment (meaning small environment made of a sealed container for isolating products from contamination and human being) and an elimination of chemical contaminant, etc.

SUMMARY OF THE INVENTION

Since, in processes for manufacturing a semiconductor, particularly, in pre-processes thereof, semiconductor substrates are transported between respective processes, various semiconductor-accommodating containers (called, for example, carrier cassettes) have been used.

These semiconductor-accommodating containers are categorized into a sealed type called FOUP (Front Opening Unified Pod) and an unsealed type called OC (Open Cassette). Both types accommodate a plurality of semiconductor substrates stacked such that space intervenes therebetween.

The FOUP comprises a container body having an opening for carrying in or out the semiconductor substrates, and a cover for closing this opening. The container body is sealed by closing the cover.

In the future, the above-mentioned mini-Environment concept using the FOUP will be requested when each semiconductor substrate having a diameter of 300 mm is used. However, currently, a unsealed type OC has been also used.

Incidentally, inventors have found that the above-mentioned static elimination technique has the following problems.

That is, on a production line using the OC, an ionizer used as a static eliminator is installed above a load port in a semiconductor manufacturing apparatus. Accordingly, it is impossible to static-eliminate the semiconductor substrates after disposition thereof, by a semiconductor manufacturing apparatus, or an inspecting apparatus, or a transport robot handling section (hereafter referred to as a robot hand) provided in a semiconductor manufacturing apparatus, or the like.

If each semiconductor substrate is charged by static or the like, the robot hand cannot grasp it because the charged semiconductor substrate is slippery. This causes a handling error, and thereby an error occurs on the full-automatic line and the line is stopped.

Once the line stops, there occurs a problem of time-consuming maintenance (recovery work) thereof and decrease in productive efficiency.

And, if each semiconductor substrate is charged, a spark is generated and a leakage current is created due to discharge when the robot hand grasps the semiconductor substrate. As a result, there arises a problem of occurrence of electric damage to the semiconductor substrate.

And, if a handling error of the robot hand causes a semiconductor substrate to move, there arises a problem of generation of particles.

Moreover, if the semiconductor substrate is charged, adhesion of foreign materials to the semiconductor substrate is increased and thereby there arises a problem of decrease of yield in the semiconductor substrate.

When the FOUP, which is a sealed semiconductor-accommodating container for the semiconductor substrates having a diameter of 300 mm, is used, the inventors found that the following problems are included in a SEMI (Semiconductor Equipment and Materials International) standard in which a specification about the FOUP is incorporated.

That is, as shown in a comparative example of FIG. 12, the SEMI standards E47.1 and E62 provide that if a length L of a semiconductor-accommodating container 200 is (y33), y33=165.5 mm±0.5 mm and that if a step D between a connected surface 120*a* of an opener 120 and a surface 150*a* of a surface plate 150 has a tolerance of (y34), y34=±0.25 mm.

Accordingly, a cover 220 of the semiconductor-accommodating container 200 may be retracted up to 1 mm from the front external periphery of a container body 210. The container length L of the entire semiconductor-accommodating container 200 may be a minimum value of 165 mm.

With respect to a distance for parallel moving the semiconductor-accommodating container 200, the container length L is often adjusted to be 165.5 mm for the container. In the case of the semiconductor-accommodating container 200 which has a small container length L or in which the cover 220 is retracted, when the cover 220 is opened, the opener 120 can not close adhere to the cover 220 of the semiconductor-accommodating container 200.

In this case, a rotary key 121 cannot be satisfactorily inserted into the cover 220. Rotation of the rotary key 121 causes damage to a plate located in the side of an exposure surface 220*a* of the cover 220, and can unsatisfactorily rotate a key groove 221 of side of the cover 220. As a result, there arises such a problem that the cover 220 is not opened.

Further, when the cover 220 is closed, the rotary key 121 is rotated with the cover 220 incompletely fit into the semiconductor-accommodating container 200, so that there arises such a problem that the semiconductor-accommodating container 200 is closed.

An object of the present invention is to provide a method of manufacturing a semiconductor integrated circuit device for decreasing foreign materials that adhere to a semiconductor substrate and for improving a yield.

Further, an object of the present invention is to provide a method of manufacturing a semiconductor integrated circuit device for decreasing handling errors and for increasing an operating ratio of manufacturing a semiconductor manufacturing apparatus.

Additionally, an object of the present invention is to provide a method of manufacturing a semiconductor integrated circuit device for eliminating a damage to a semiconductor substrate, which is caused by discharge, and for improving a yield.

Further, an object of the present invention is to provide a method of manufacturing a semiconductor integrated circuit device for eliminating a damage to a semiconductor-accommodating container and for extending an useful period.

Further, an object of the present invention is to provide a method of manufacturing a semiconductor integrated circuit device for decreasing errors in opening or closing a semiconductor-accommodating container and for reducing inactive time on a semiconductor manufacturing apparatus and a productive line.

The above-mentioned and other objects and novel features of the present invention will be apparent from description of the present specification and accompanied drawings.

Of inventions disclosed in the present application, representative ones will be briefly described as follows.

Namely, the present invention is one that a sealed type semiconductor-accommodating container accommodating a semiconductor substrate is set on a load port of a semiconductor manufacturing apparatus, and that the semiconductor substrate taken out of this semiconductor-accommodating container is processed by a treatment section in a transport area between said load port and treatment area, and the semiconductor substrate processed by said treatment section is static-eliminated and is accommodated in said semiconductor-accommodating container positioned on the load port.

Further, the present invention comprises the steps of: linking an internal space of a first sealed type semiconductor-accommodating container which accommodates and is filled with a plurality of wafers grounded, to a local cleaning chamber of a first wafer treatment apparatus with cleanliness kept; transporting at least of one of said plurality of wafers accommodated in said first semiconductor-accommodating container under said linking state by means of a transport mechanism provided in said local cleaning chamber, and thereby accommodating the at least one in a wafer treatment section of said first wafer treatment apparatus; executing a first treatment relative to said wafer accommodated in said first wafer treatment section; transporting said processed wafer by said transport mechanism after said step (c), and thereby accommodating said processed wafer grounded in said first semiconductor-accommodating container; static-eliminating said processed wafer after said step (c) and before the step (d), or during the step (d); and releasing the linking state between said first semiconductor-accommodating container and said local cleaning chamber after said step (d), and thereby returning said first semiconductor-accommodating container to a full state.

Further, the present invention is one that a semiconductor-accommodating container is located on a stage of a semiconductor-accommodating container opening/closing apparatus provided with an opener having a connection surface projecting from the surface of a surface plate, and the connection surface of said opener is closely brought into contact with an exposed surface of a semiconductor-accommodating container of said cover, and said cover is held by said opener, and said cover is opened or closed, and thereby said semiconductor substrate is carried in or out.

Further, the present invention comprises the steps of: locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed, such that a connection surface of said opener projects over 0.25 mm from a surface of said surface plate; closely bringing the connection surface of said opener into contact with an exposed surface of said cover, and holding said cover by said opener; vertically moving said cover relative to an opening surface of said semiconductor-accommodating container by said opener, and opening said cover, and connecting an opening portion of said semiconductor-accommodating container and an opening portion of said surface plate of said semiconductor-accommodating container opening/closing apparatus to each other; and carrying said semiconductor substrate into or from semiconductor-accommodating container, through an opening portion of said semiconductor-accommodating container and an opening portion of said semiconductor-accommodating container opening/closing apparatus, between said semiconductor-accommodating container and a semiconductor manufacturing apparatus in which said semiconductor-accommodating container opening/closing apparatus is located.

Other aspects included in the present invention will be described by stating items.

1. A method of manufacturing a semiconductor integrated circuit device, comprises the steps of:

(a) locating a semiconductor-accommodating container on a stage of a semiconductor-accommodating container opening/closing apparatus, wherein-said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed, such that a connection surface of said opener projects over 0.25 mm from a surface of said surface plate; closely bringing the connection surface of said opener into contact with an exposed surface of said cover, and holding said cover by said opener;

(b) closely bringing the connection surface of said opener into contact with the exposed surface of said cover, and opening said cover by said opener, and taking out said semiconductor substrate, and transporting said semiconductor substrate into a semiconductor manufacturing apparatus in which said semiconductor-accommodating container opening/closing apparatus is located;

(c) transporting said semiconductor substrate to a treatment section of said semiconductor manufacturing apparatus, and thereafter processing said semiconductor substrate in said treatment section;

(d) moving the semiconductor substrate processed at said step (c), to the transport area in the semiconductor manufacturing apparatus, and static-eliminating said semiconductor substrate in said transport area; and (e) moving and accommodating said semiconductor substrate static-eliminated at said step (d) to and in the semiconductor-accommodating container.

2. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed, such that a connection surface of said opener projects 0.25 to 10 mm from a surface of said surface plate; closely bringing the connection surface of said opener into contact with an exposed surface of said cover, and holding said cover by said opener;

(b) closely bringing the connection surface of said opener into contact with the exposed surface of said cover, and opening said cover by said opener, and taking out said semiconductor substrate, and transporting said semiconductor substrate into a semiconductor manufacturing apparatus in which said semiconductor-accommodating container opening/closing apparatus is located;

(c) transporting said semiconductor substrate to a treatment section of said semiconductor manufacturing apparatus, and thereafter processing said semiconductor substrate in said treatment section;

(d) moving the semiconductor substrate processed at said step (c), to the transport area in the semiconductor manufacturing apparatus, and static-eliminating said semiconductor substrate in said transport area; and (e) moving and accommodating said semiconductor substrate static-eliminated at said step (d) to and in the semiconductor-accommodating container.

3. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed, such that a connection surface of said opener projects 1 mm from a surface of said surface plate; closely bringing the connection surface of said opener into contact with an exposed surface of said cover, and holding said cover by said opener;

(b) closely bringing the connection surface of said opener into contact with the exposed surface of said cover, and opening said cover by said opener, and taking out said semiconductor substrate, and transporting said semiconductor substrate into a semiconductor manufacturing apparatus in which said semiconductor-accommodating container opening/closing apparatus is located;

(c) transporting said semiconductor substrate to a treatment section of said semiconductor manufacturing apparatus, and thereafter processing said semiconductor substrate in said treatment section;

(d) moving the semiconductor substrate processed at said step (c), to the transport area in the semiconductor manufacturing apparatus, and static-eliminating said semiconductor substrate in said transport area; and (e) moving and accommodating said semiconductor substrate static-eliminated at said step (d) to and in the semiconductor-accommodating container.

4. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed, such that a connection surface of said opener projects over 0.25 to 10 mm from a surface of said surface plate; closely bringing the connection surface of said opener into contact with an exposed surface of said cover, and holding said cover by said opener;

(b) closely bringing the connection surface of said opener into contact with the exposed surface of said cover, and opening said cover by said opener, and taking out said semiconductor substrate, and transporting said semiconductor substrate into a semiconductor manufacturing apparatus in which said semiconductor-accommodating container opening/closing apparatus is located;

(c) transporting said semiconductor substrate to a treatment section of said semiconductor manufacturing apparatus, and processing said semiconductor substrate in said treatment section;

(d) transporting said semiconductor substrate to a treatment section of said semiconductor manufacturing apparatus, and thereafter processing said semiconductor substrate in said treatment section;

(e) moving said semiconductor substrate processed at said step (d) to the transport area in said semiconductor manufacturing apparatus, and static-eliminating said semiconductor substrate in said transport area; and (f) moving and accommodating said semiconductor substrate static-eliminated at said step (e) to and in said semiconductor-accommodating container.

Further other aspects included in the present invention will be described by stating items.

1. A method of manufacturing a semiconductor integrated circuit device comprises the steps of:

(a) locating a sealed type semiconductor-accommodating container accommodating a semiconductor substrate, on a stage of a semiconductor-accommodating container opening/closing apparatus;

(b) opening cover of said semiconductor-accommodating container by an opener of said semiconductor-accommodating container opening/closing apparatus, and taking out said semiconductor substrate, and transporting said semiconductor substrate into a semiconductor manufacturing apparatus in which the semiconductor-accommodating container opening/closing apparatus is set;

(c) transporting said semiconductor substrate to a treatment section of said semiconductor manufacturing apparatus, and thereafter processing said semiconductor substrate in said treatment section;

(d) moving said semiconductor substrate processed at said step (c) into the transport area of said semiconductor manufacturing apparatus, and static-eliminating said semiconductor substrate in said transport area; and (e) moving and accommodating the semiconductor substrate static-eliminated at said step (d) to and in said semiconductor-accommodating container.

2. A method of manufacturing a semiconductor integrated circuit device comprises the steps of:

(a) locating, on a stage of a semiconductor-accommodating container, a sealed type semiconductor-accommodating container which accommodates a semiconductor substrate and in which a contact portion being in contact with at least said semiconductor substrate is formed by conductive materials;

(b) opening cover of said semiconductor-accommodating container by an opener of said semiconductor-accommodating container opening/closing apparatus, and taking out said semiconductor substrate, and transporting said semiconductor substrate into a semiconductor manufacturing apparatus in which the semiconductor-accommodating container opening/closing apparatus is set;

(c) moving said semiconductor substrate to a transport area in said semiconductor manufacturing apparatus, and static-eliminating said semiconductor substrate in said transport area;

(d) transporting said semiconductor substrate to a treatment section of said semiconductor manufacturing apparatus, and thereafter processing said semiconductor substrate in said treatment section;

(e) moving said semiconductor substrate processed at said step (d) into said transport area of said semiconductor manufacturing apparatus, and static-eliminating said semiconductor substrate in said transport area; and (f) moving and accommodating the semiconductor substrate static-eliminated at said step (e) to and in said semiconductor-accommodating container.

3. A method of manufacturing a semiconductor integrated circuit device comprises the steps of:

(a) locating, on a stage of a semiconductor-accommodating container, a sealed type semiconductor-accommodating container which accommodates a semiconductor substrate and in which a contact portion being in contact with at least said semiconductor substrate is formed by conductive materials;

(b) opening cover of said semiconductor-accommodating container by an opener of said semiconductor-accommodating container opening/closing apparatus, and taking out said semiconductor substrate, and transporting said semiconductor substrate into a semiconductor manufacturing apparatus in which the semiconductor-accommodating container opening/closing apparatus is set;

(c) static-eliminating, in said transport area, a robot hand which is located in said transport area and is ungrounded, and transporting said semiconductor substrate in the treatment section of said semiconductor manufacturing apparatus by this ungrounded robot hand;

(d) processing said semiconductor substrate in said treatment section;

(e) moving said semiconductor substrate processed at said step (d) to said transport area in said semiconductor manufacturing apparatus, and static-eliminating said semiconductor substrate in said transport area; and (f) moving and accommodating said semiconductor substrate static-eliminated at said step (e) to and in said semiconductor-accommodating container.

4. A method of manufacturing a semiconductor integrated circuit device comprises the steps of:

(a) locating, on a stage of a semiconductor-accommodating container, a sealed type semiconductor-accommodating container which accommodates a semiconductor substrate and in which a contact portion being in contact with at least said semiconductor substrate is formed by conductive materials;

(b) opening cover of said semiconductor-accommodating container by an opener of said semiconductor-accommodating container opening/closing apparatus, and taking out said. semiconductor substrate, and transporting said semiconductor substrate into a semiconductor manufacturing apparatus in which the semiconductor-accommodating container opening/closing apparatus is set;

(c) moving said semiconductor substrate to a transport area in said semiconductor manufacturing apparatus, and thereafter processing said semiconductor substrate in said treatment section;

(d) moving the semiconductor substrate processed at said step (c) to a load lock chamber in said semiconductor manufacturing apparatus, and supporting said semiconductor substrate by means of an substrate supporting stand ungrounded in this load lock chamber;

(e) moving said semiconductor substrate from said load lock chamber to a transport area of said semiconductor manufacturing apparatus, and static-eliminating said semiconductor substrate in-said transport area; and (f) moving and accommodating said semiconductor substrate static-eliminated at said step (e) to and in said semiconductor-accommodating container.

5. A method of manufacturing a semiconductor integrated circuit device comprises the steps of:

(a) locating a semiconductor-accommodating container accommodating a semiconductor substrate on a load port of a semiconductor manufacturing apparatus;

(b) taking out said semiconductor substrate from said semiconductor-accommodating container, and transporting said semiconductor substrate to a treatment section of said semiconductor manufacturing apparatus;

(c) process-treating said semiconductor substrate in said treatment section;

(d) moving the semiconductor substrate processed at said step (c) to a transport area between said treatment section and said load port in said semiconductor manufacturing apparatus, and static-eliminating said semiconductor substrate in said transport area; and (e) accommodating the semiconductor substrate static-eliminated at said step (d), in said semiconductor-accommodating container located on said load port of said semiconductor manufacturing apparatus.

6. A method of manufacturing a semiconductor integrated circuit device, comprises the steps of:

(a) locating, on a load port-of a semiconductor manufacturing apparatus, a semiconductor-accommodating container which accommodates a semiconductor substrate and in which a contact portion being in contact with at least said semiconductor substrate is formed by conductive materials and which is grounded;

(b) taking said semiconductor substrate from said semiconductor-accommodating container and moving said semiconductor substrate to a transport area of said semiconductor manufacturing apparatus having a treatment section and said transport area;

(c) static-eliminating said semiconductor substrate in said transport area by an ionizer;

(d) moving said semiconductor substrate to said treatment section and process-treating said semiconductor substrate in said treatment section;

(e) moving the semiconductor substrate processed at said step (d) to said transport area and static-eliminating said semiconductor substrate in said transport area by said ionizer; and (f) accommodating the semiconductor substrate static-eliminated at said step (e), in said semiconductor-accommodating container located on said load port.

7. A method of manufacturing a semiconductor integrated circuit device comprises the steps of:

(a) locating, on a load port of a semiconductor manufacturing apparatus, a semiconductor-accommodating container which accommodates a semiconductor substrate and in which a contact portion being in contact with at least said semiconductor substrate is formed by conductive materials and which is grounded;

(b) taking said semiconductor substrate from said. semiconductor-accommodating container and moving said semiconductor substrate to a transport area of said semiconductor manufacturing apparatus having a treatment section and said transport area;

(c) supporting said semiconductor substrate by a robot hand static-eliminated in said transport area, and static-eliminating said semiconductor substrate in said transport area;

(d) moving said semiconductor substrate to said treatment section by said robot hand, and processing said semiconductor substrate in said treatment section;

(e) moving, to said transport area, said semiconductor substrate processed at said step (d), and supporting said semiconductor substrate by said robot hand in said transport area, and static-eliminating said the semiconductor substrate; and (f) accommodating said semiconductor substrate static-eliminated at said step (e), in said semiconductor-accommodating container located on said load port.

8. A method of manufacturing a semiconductor integrated circuit device comprises the steps of:

(a) locating, on a load port of a semiconductor manufacturing apparatus, a semiconductor-accommodating container which accommodates a semiconductor substrate and in which a contact portion being in contact with at least said semiconductor substrate is formed by conductive materials;

(b) opening a cover of said semiconductor-accommodating container by an opener of a semiconductor-accommodating container opening/closing apparatus provided in said semiconductor manufacturing apparatus, and taking out said semiconductor substrate, and transporting said semiconductor substrate into said semiconductor manufacturing apparatus;

(c) transporting said semiconductor substrate to a treatment section of said semiconductor manufacturing apparatus, and thereafter process-treating said semiconductor substrate in said treatment section;

(d) moving said semiconductor substrate processed at said step (c), to a transport area in said semiconductor manufacturing apparatus between said treatment section and said load port, and static-eliminating said semiconductor substrate in said transport area; and (e) moving and accommodating said semiconductor substrate static-eliminated at said step (d) to and in said semiconductor-accommodating container.

9. A method of manufacturing a semiconductor integrated circuit device according to item 8, wherein cleanliness of said transport area is higher than that of a periphery of said load port.

10. A method of manufacturing a semiconductor integrated circuit device comprises the steps of:

(a) locating, on a stage of a semiconductor-accommodating container opening/closing apparatus, a semiconductor-accommodating container which accommodates a semiconductor substrate and whose the entire is formed of conductive materials;

(b) opening a cover of said semiconductor-accommodating container by a opener of said semiconductor-accommodating container opening/closing apparatus, and taking out semiconductor substrate, and transporting said semiconductor substrate into semiconductor manufacturing apparatus in which said semiconductor-accommodating container opening/closing apparatus is provided;

(c) transporting said semiconductor substrate to a treatment section of said semiconductor manufacturing apparatus, and thereafter process-treating said semiconductor substrate in said treatment section;

(d) moving said semiconductor substrate processed at said step (c), to a transport area in said semiconductor manufacturing apparatus, and static-eliminating said semiconductor substrate in said transport area; and (e) moving and accommodating said semiconductor substrate static-eliminated at said step (d) to and in said semiconductor-accommodating container.

11. A method of manufacturing a semiconductor integrated circuit device comprises the steps of:

(a) locating, on a stage of a semiconductor-accommodating container opening/closing apparatus, a semiconductor-accommodating container which accommodates a semiconductor substrate and whose the entire is formed of conductive materials;

(b) opening a cover of said semiconductor-accommodating container by a opener of said semiconductor-accommodating container opening/closing apparatus, and taking out semiconductor substrate, and transporting said semiconductor substrate into semiconductor manufacturing apparatus in which said semiconductor-accommodating container opening/closing apparatus is provided;

(c) moving said semiconductor substrate to a transport area in said semiconductor manufacturing apparatus and static-eliminating said semiconductor substrate in said transport area;

(d) transporting said semiconductor substrate to a treatment section of said semiconductor manufacturing apparatus, and thereafter process-treating said semiconductor substrate in said treatment section;

(e) moving the semiconductor substrate processed at said step (d), to a transport area in said semiconductor manufacturing apparatus, and static-eliminating said semiconductor substrate in said transport area; and (f) moving and accommodating said semiconductor substrate static-eliminated at said step (e) to and in said semiconductor-accommodating container.

12. A method of manufacturing a semiconductor integrated circuit device comprises the steps of:

(a) locating, on a stage of a semiconductor-accommodating container, a semiconductor-accommodating container which accommodates a semiconductor substrate and in which a contact portion being in contact with at least said semiconductor substrate is formed by conductive materials;

(b) opening cover of said semiconductor-accommodating container by an opener of said semiconductor-accommodating container opening/closing apparatus, and taking out said semiconductor substrate, and transporting said semiconductor substrate into a semiconductor manufacturing apparatus in which the semiconductor-accommodating container opening/closing apparatus is set;

(c) moving said semiconductor substrate to a transport area in said semiconductor manufacturing apparatus, and thereafter process-treating said semiconductor substrate in said treatment section;

(d) moving the semiconductor substrate processed at said step (c), to a transport area in said semiconductor manufacturing apparatus, and static-eliminating said semiconductor substrate in said transport area, and preventing said semiconductor substrate from being contaminated in chemical, by a chemical filter provided in said transport area; and (e) moving and accommodating said semiconductor substrate static-eliminated at said step (d) to and in said semiconductor-accommodating container.

13. A method of manufacturing a semiconductor integrated circuit device according to item 12, further comprises a step of preventing said semiconductor substrate from being contaminated in chemical, by said chemical filter in said transport area, before and after process of said semiconductor substrate in said treatment section.

14. A method of manufacturing a semiconductor integrated circuit device according to item 1, further comprises a step of single-wafer-processing said semiconductor substrate in said treatment section of said semiconductor manufacturing apparatus.

15. A method of manufacturing a semiconductor integrated circuit device according to item 14, wherein, during a single wafer process of said semiconductor substrate in said treatment section of said semiconductor manufacturing apparatus, a semiconductor substrate to be next-processed waits in a load lock chamber of said semiconductor manufacturing apparatus.

16. A method of manufacturing a semiconductor integrated circuit device according to item 1, further comprises a step of moving vertically said cover relative to an opening surface of said semiconductor-accommodating container by said opener of said semiconductor-accommodating container opening/closing apparatus, and opening said cover, and carrying in or out said semiconductor substrate while said semiconductor substrate is carried in or out into said semiconductor-accommodating container.

17. A method of manufacturing a semiconductor integrated circuit device according to item 1, wherein a substrate having a diameter of 300 mm is used as said semiconductor substrate.

18. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed, such that a connection surface of said opener projects over 0.25 mm from a surface of said surface plate;

closely bringing the connection surface of said opener into contact with an exposed surface of said cover, and holding said cover by said opener;

(b) closely bringing the connection surface of said opener into contact with the exposed surface of said cover, and holding said cover by said opener;

(c) moving vertically said cover relative an opening surface of said semiconductor-accommodating container by said opener, and opening said cover, and connecting an opening portion and the opening portion of said surface plate of said semiconductor-accommodating container opening/closing apparatus; and (d) carrying in or out said semiconductor substrate to or from said semiconductor-accommodating container via the opening of said semiconductor-accommodating container and the opening of said semiconductor-accommodating container opening/closing apparatus between said semiconductor-accomodating container and a semiconductor manufacturing apparatus in which said semiconductor-accommodating container is provided.

19. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed, such that a connection surface of said opener projects over 0.3 mm from a surface of said surface plate; closely bringing the connection surface of said opener into contact with an exposed surface of said cover, and holding said cover by said opener;

(b) closely bringing the connection surface of said opener into contact with the exposed surface of said cover, and holding said cover by said opener;

(c) moving vertically said cover relative an opening surface of said semiconductor-accommodating container by said opener, and opening said cover, and connecting an opening portion and the opening portion of said surface plate of said semiconductor-accommodating container opening/closing apparatus; and (d) carrying in or out said semiconductor substrate to or from said semiconductor-accommodating container via the opening of said semiconductor-accommodating container and the opening of said semiconductor-accommodating container opening/closing apparatus between said semiconductor-accommodating container and a semiconductor manufacturing apparatus in which said semiconductor-accommodating container is provided.

20. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed, such that a connection surface of said opener projects over 0.7 mm from a surface of said surface plate;

closely bringing the connection surface of said opener into contact with an exposed surface of said cover, and holding said cover by said opener;

(b) closely bringing the connection surface of said opener into contact with the exposed surface of said cover, and holding said cover by said opener;

(c) moving vertically said cover relative an opening surface of said semiconductor-accommodating container by said opener, and opening said cover, and connecting an opening portion and the opening portion of said surface plate of said semiconductor-accommodating container opening/closing apparatus; and (d) carrying in or out said semiconductor substrate to or from said semiconductor-accommodating container via the opening of said semiconductor-accommodating container and the opening of said semiconductor-accommodating container opening/closing apparatus between said semiconductor-accommodating container and a semiconductor manufacturing apparatus in which said semiconductor-accommodating container is provided.

21. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a-semiconductor substrate, an opener for opening or closing a cover of said semiconductor-accommodating container, and a surface plate in which an opening portion for locating said opener is formed, such that a connection surface of said opener projects at 1.0 mm from a surface of said surface plate; closely bringing the connection surface of said opener into contact with an exposed surface of said cover, and holding said cover by said opener;

(b) closely bringing the connection surface of said opener into contact with the exposed surface of said cover, and holding said cover by said opener;

(c) moving vertically said cover relative an opening surface of said semiconductor-accommodating container by said opener, and opening said cover, and connecting an opening portion and the opening portion of said surface plate of said semiconductor-accommodating container opening/closing apparatus; and (d) carrying in or out said semiconductor substrate to or from said semiconductor-accommodating container via the opening of said semiconductor-accommodating container and the opening of said semiconductor-accommodating container opening/closing apparatus between said semiconductor-accommodating container and a semiconductor manufacturing apparatus in which said semiconductor-accommodating container is provided.

22. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accomodating container accommodating a semiconductor substrate, an opener for opening or closing a cover of said semiconductor-accommodating container, and a surface plate in which an opening portion for locating said opener is formed, such that an overlap amount between a distance between a surface of said surface plate and the connection surface of said opener, and a distance between a facial reference surface and an exposed surface of said cover of said semiconductor-accommodating container is set to be more than zero;

(b) closely bringing the connection surface of said opener into contact with the exposed surface of said cover, and holding said cover by said opener;

(c) moving vertically said cover relative an opening surface of said semiconductor-accommodating container by said opener, and opening said cover, and connecting an opening portion and the opening portion of said surface plate of said semiconductor-accommodating container opening/closing apparatus; and (d) carrying in or out said semiconductor substrate to or from said semiconductor-accommodating container via the opening of said semiconductor-accommodating container and the opening of said semiconductor-accommodating container opening/closing apparatus between said semiconductor-accommodating container and a semiconductor manufacturing apparatus in which said semiconductor-accommodating container is provided, wherein said overlap amount of each of all semiconductor-accommodating containers moving on a semiconductor manufacturing line is more than zero.

23. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed, such that an overlap amount between a distance between a surface of said surface plate and the connection surface of said opener, and a distance between a facial reference surface and an exposed surface of said cover of said semiconductor-accommodating container is set to be more than zero and 1.25 mm or less;

(b) closely bringing the connection surface of said opener into contact with the exposed surface of said cover, and holding said cover by said opener;

(c) moving vertically said cover relative an opening surface of said semiconductor-accommodating container by said opener, and opening said cover, and connecting an opening portion and the opening portion of said surface plate of said semiconductor-accommodating container opening/closing apparatus; and (d) carrying in or out said semiconductor substrate to or from said semiconductor-accommodating container via the opening of said semiconductor-accommodating container and the opening of said semiconductor-accommodating container opening/closing apparatus between said semiconductor-accommodating container and a semiconductor manufacturing apparatus in which said semiconductor-accommodating container is provided, wherein said overlap amount of each of all semiconductor-accommodating containers moving on a semiconductor manufacturing line is more than zero and 1.25 mm or less.

24. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed;

(b) holding said cover by said opener;

(c) moving vertically said cover relative an opening surface of said semiconductor-accommodating container by said opener, and opening said cover, and connecting an opening portion and the opening portion of said surface plate of said semiconductor-accommodating container opening/closing apparatus; and (d) carrying in or out said semiconductor substrate to or from said semiconductor-accommodating container via the opening of said semiconductor-accommodating container and the opening of said semiconductor-accommodating container opening/closing apparatus between said semiconductor-accommodating container and a semiconductor manufacturing apparatus in which said semiconductor-accommodating container is provided, wherein a rate of no close contact portion between the connection surface of said opener and the exposed surface of said cover is 1% or less out of all semiconductor-accommodating containers moving on a semiconductor manufacturing line when said opener holds said cover in said step (b).

25. A method of manufacturing a semiconductor integrated circuit device comprises the steps of:

(a) locating a semiconductor-accommodating container on a stage of a semiconductor-accommodating container opening/closing apparatus, wherein said semiconductor-accommodating container opening/closing apparatus comprises said stage capable of locating said semiconductor-accommodating container accommodating a semiconductor substrate, an opener for opening or closing a cover of said semiconductor-accommodating container, and a surface plate in which an opening portion for locating said opener is formed, such that a connection surface of said opener projects from a surface of said surface plate; closely bringing the connection surface of said opener into contact with an exposed surface of said cover, and holding said cover by said opener;

(b) closely bringing the connection surface of said opener into contact with the exposed surface of said cover, and holding said cover by said opener, with said opener retreated by said cover;

(c) moving vertically said cover relative an opening surface of said semiconductor-accommodating container by said opener, and opening said cover, and connecting an opening portion and the opening portion of said surface plate of said semiconductor-accommodating container opening/closing apparatus; and (d) carrying in or out said semiconductor substrate to or from said semiconductor-accommodating container via the opening of said semiconductor-accommodating container and the opening of said semiconductor-accommodating container opening/closing apparatus between said semiconductor-accommodating container and a semiconductor manufacturing apparatus in which said semiconductor-accommodating container is provided.

26. A method of manufacturing a semiconductor integrated circuit device according to item 18, further comprises a step of closely bringing the connection surface of said opener into contact with the exposed surface of said cover, and retreating said cover by said opener when said opener holds said cover of said semiconductor-accommodating container.

27. A method of manufacturing a semiconductor integrated circuit device according to item 18, further comprises a step of single-wafer-processing said semiconductor substrate in a treatment section of said semiconductor manufacturing apparatus.

28. A method of manufacturing a semiconductor integrated circuit device according to item 27, wherein, during a single wafer process of said semiconductor substrate in said treatment section of said semiconductor manufacturing apparatus, a semiconductor substrate to be next-processed waits in a load lock chamber of said semiconductor manufacturing apparatus.

29. A method of manufacturing a semiconductor integrated circuit device according to item 18, wherein a substrate having a diameter of 300 mm is used as said semiconductor substrate.

BRIEF DESCRIPTION OF THE DRAWINGS

FIGS. 1A and B are external perspective views showing a structural example of a semiconductor-accommodating container opening/closing apparatus used for the method of manufacturing a semiconductor integrated circuit device according to embodiment 1 of the present invention, wherein FIG. 1A shows a front structure and FIG. 1B illustrates a rear structure.

DESCRIPTION OF THE PREFERRED EMBODIMENTS

Figure 1A:
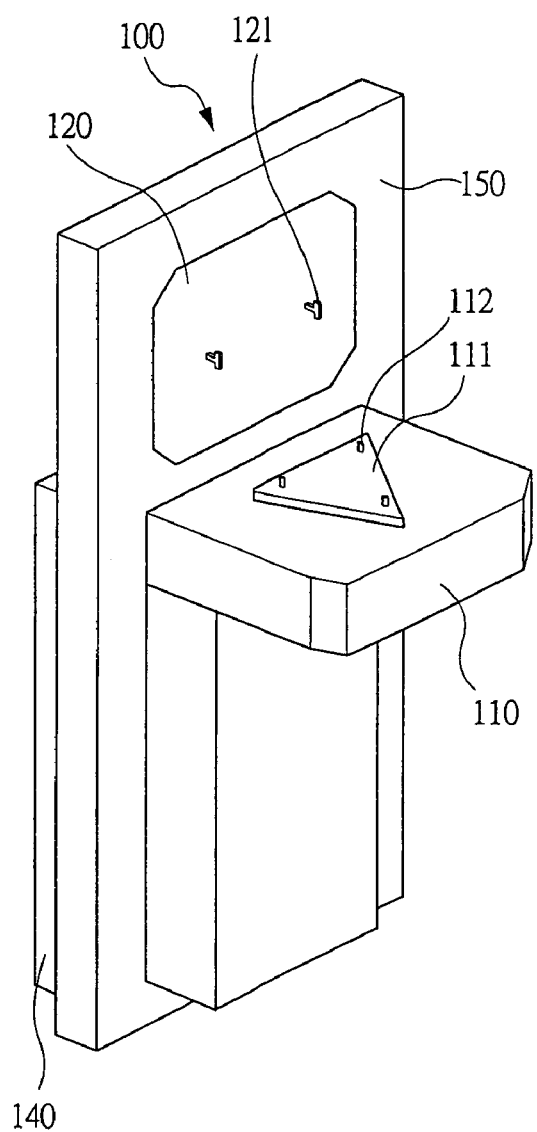

1. A semiconductor substrate or a semiconductor wafer means a silicon single-crystal substrate, an SOI (Silicon On Insulator) substrate (generally disk-shaped), a sapphire substrate, a glass substrate, other insulating or semi-insulating or semiconductor substrates or the like, or a composite substrate thereof. A semiconductor integrated circuit device described in the present application also means a semiconductor such as a silicon wafer, a sapphire substrate or the like; something formed on an insulating substrate; or something formed on other insulating substrates made from glasses or the like such as TFT (Thin Film Transistor) and STN (Super Twisted Nematic) liquid crystals and the like, particularly except for the cases specified.

2. Semiconductor-accommodating container: This means a container for accommodating a plurality of semiconductor substrates. In this, a FOUP means a sealed type container comprising a cover and a container body.

3. Facial reference surface: This means to divide the semiconductor substrate into two parts and means a vertical surface parallel to a front side (which the semiconductor substrate is removed from or inserted into) of the semiconductor-accommodating container.

4. Semiconductor-accommodating container opening/closing apparatus: This means an apparatus for opening and closing a cover of a wafer-accommodating container such as FOUP, and, for example, comprises a metal plate or the like called an opener.

5. Treatment section: For example, a wafer treatment section means an apparatus portion for accommodating wafers therein and performing predetermined treatment similarly to a plasma reaction chamber in a dry etching apparatus, and generally does not include a transport section or a wait section for only carrying the wafers thereto.

6. Transport area: This means a section of mainly carrying in or out wafers between a semiconductor-accommodating container such as FOUP and the wafer treatment section, and, for example, means a region or the like between a load port and the wafer treatment section. Accordingly, in the case where there is provided an auxiliary treatment section for pre-alignment, etc., such the section is generally included in the transport area, too.

7. Ionizer: This means an apparatus for generating positive and negative ions by ionizing ambient atmosphere gas. In semiconductor industries, the ionizer is often used for static-eliminating wafers generally by neutralizing predetermined portions. Concretely, the ionizer means an apparatus for generating a corona discharge by applying high voltage to a needle-shaped or narrow line-shaped electrode, and for ionizing positively or negatively ambient air, and for neutralizing electric charges on the surface of an electrically charged object by using a reversed-polarity ion.

8. Fan filter unit: This means an air cleaner integrating a small air blower into a ULPA (Ultra Low Penetration Air) filter. The ULPA filter is air filter having a particle collecting ratio of 99.9995% or more relative to a particle having a diameter of 0.15 μm at a rated air flow.

9. Chemical filter: This means a filter having a purpose of removing gaseous pollutant in air Embodiments of the present invention will be described in detail with reference to the drawings.

If advantageously necessary, the following embodiments are described by dividing into a plurality of sections or sub-embodiments. However, except for particularly specified cases, these divided sections or sub-embodiments do not have anything to do with each other but one of these has something to do with one portion or the entire of the others in modifications, or detailed or supplemented explanation, or the like.

Except for the cases where the number or the like of elements (including the number of article, numeric values, amounts, ranges or the like), and for the case specified particularly, and for the case of principled and obvious restriction of the specific number, and the like, the following embodiments are limited to the specific number and may include the number more or less than or equal to the specific number.

Furthermore, in the following embodiments, needless to say, components thereof (including elemental steps or the like) are not always essential thereto, except for the cases specified particularly, and for the case thought of as in principle and obviously essential, and the like.

Likewise, in the following embodiments, reference to shapes, positional relationship or the like of the components or the like includes ones substantially similar or closely akin to the shapes or the like, except for the cases specified particularly, for the case thought of as in principle and obviously essential, and the like. This also applies to the above-mentioned numeric values and ranges.

Though all the Figures for explaining the embodiments, members having the same functions are denoted by the same reference numerals and repetitive description thereof will be omitted.

(Embodiment 1)

Figure 1B:
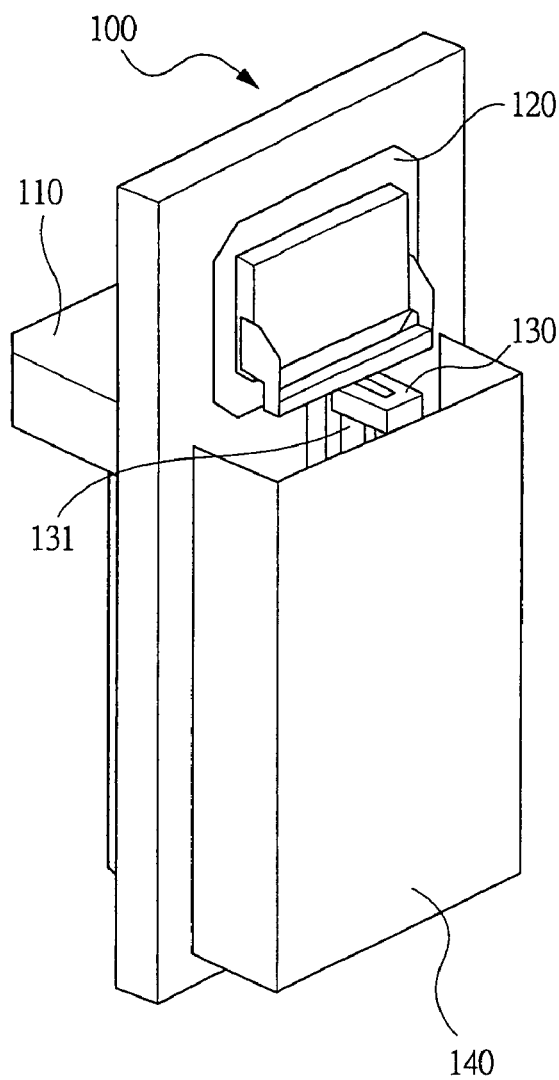
Figure 2:
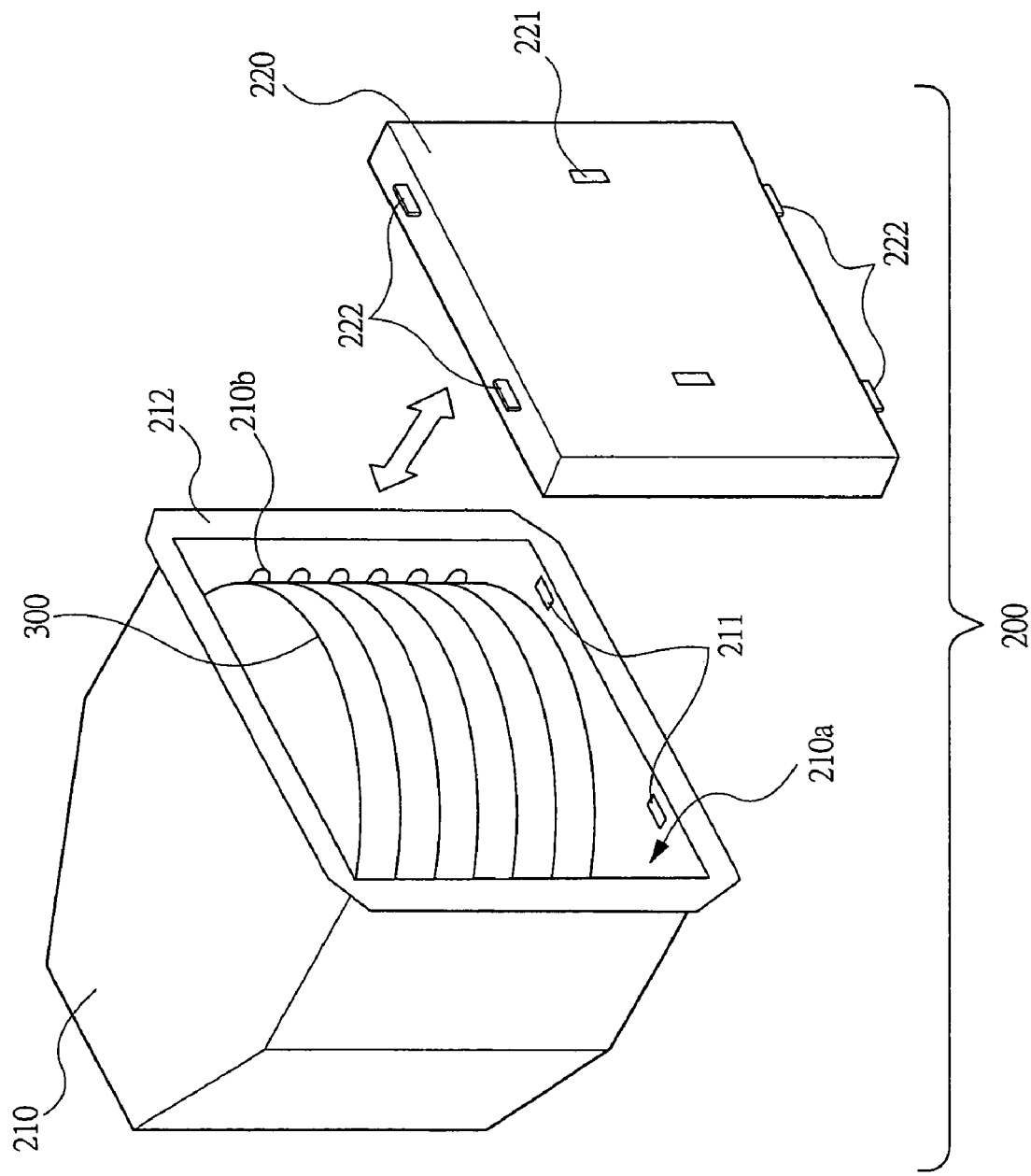
FIG. 2 is a perspective view showing a structural example of a semiconductor-accommodating container (FOUP) used for the method of manufacturing a semiconductor integrated circuit device according to embodiment 1 of the present invention.
Figure 3:
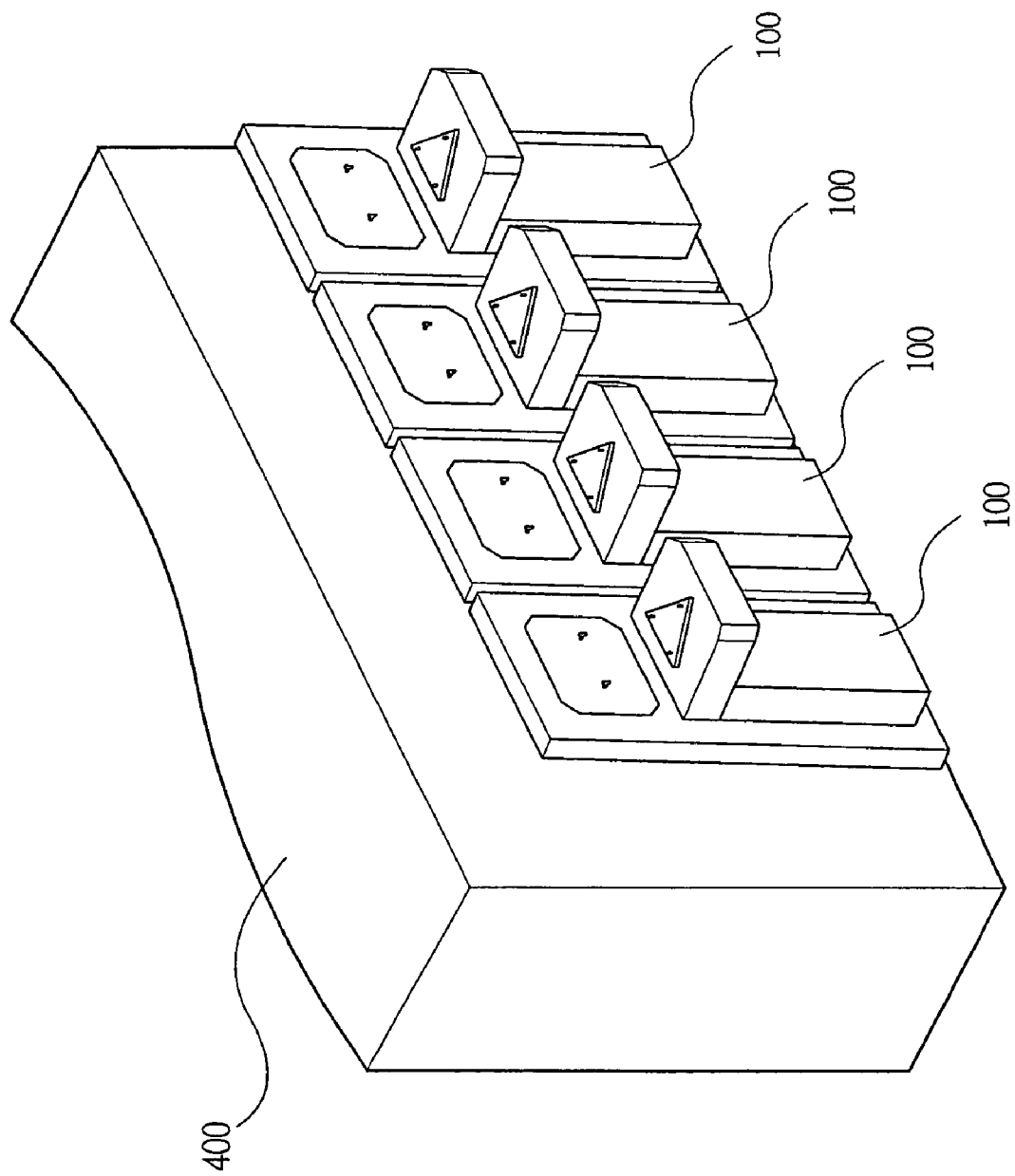
FIG. 3 is a partial perspective view showing a structural example of a semiconductor manufacturing apparatus equipped with the semiconductor-accommodating container opening/closing apparatus as shown in FIG. 1.
Figure 4:
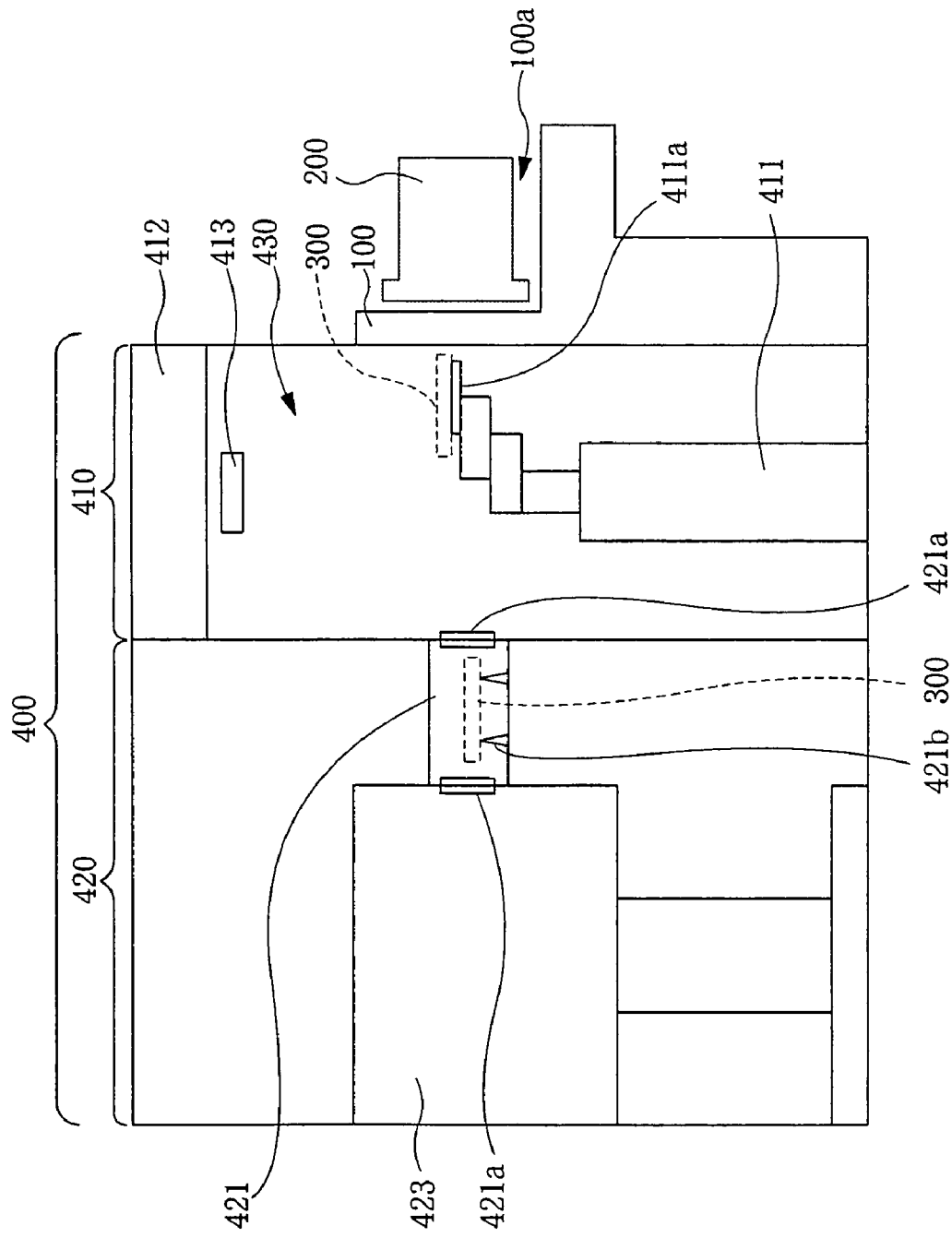
FIG. 4 is a side view showing an internal structure of the semiconductor manufacturing apparatus as shown in FIG. 3.
Figure 5:
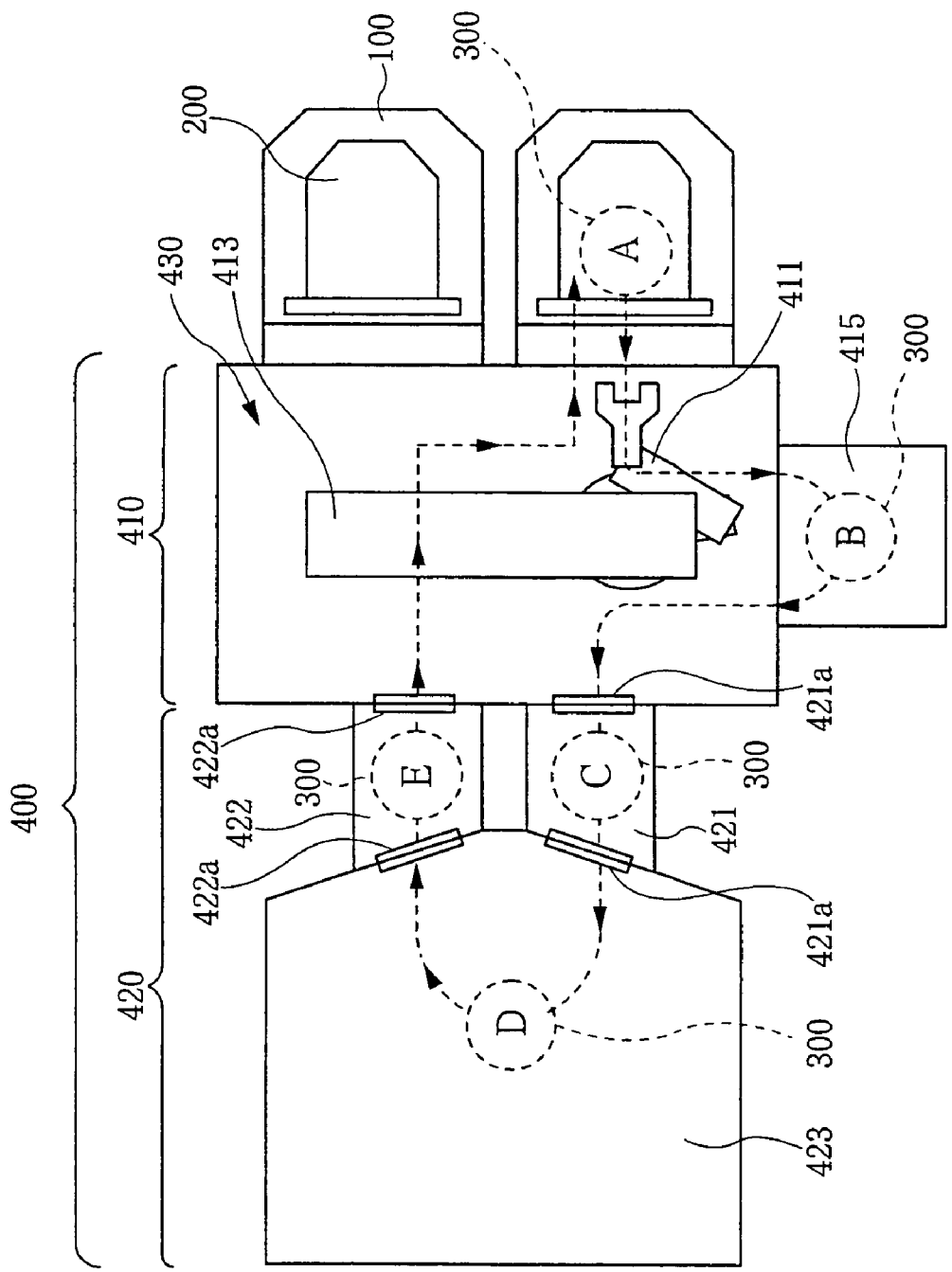
FIG. 5 is a plan view showing an internal structure of the semiconductor manufacturing apparatus as shown in FIG. 3.
Figure 6:
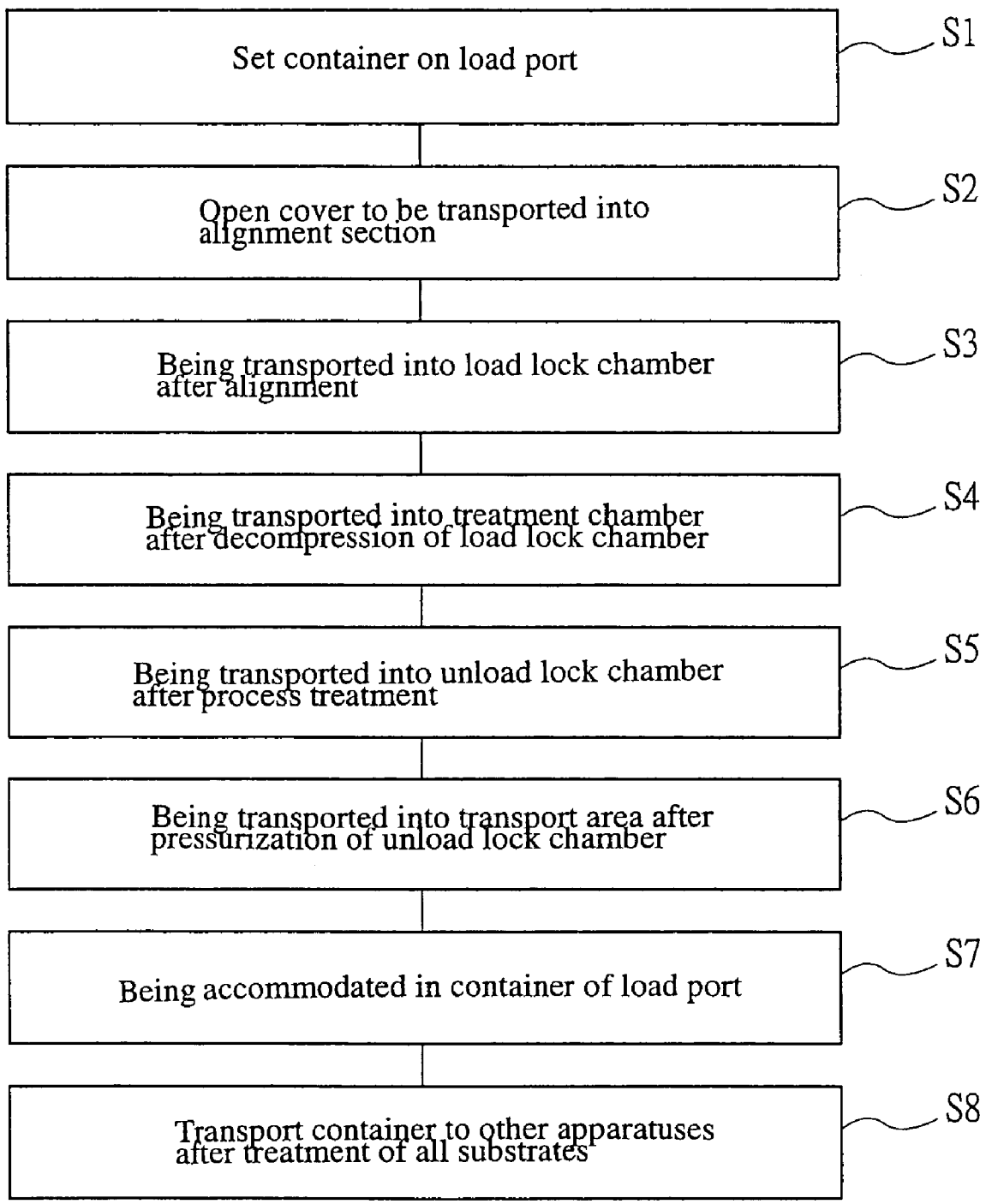
FIG. 6 is a flowchart exemplifying a transport sequence for semiconductor substrates in the method of manufacturing a semiconductor integrated circuit device according to embodiment 1 of the present invention.
Figure 7:
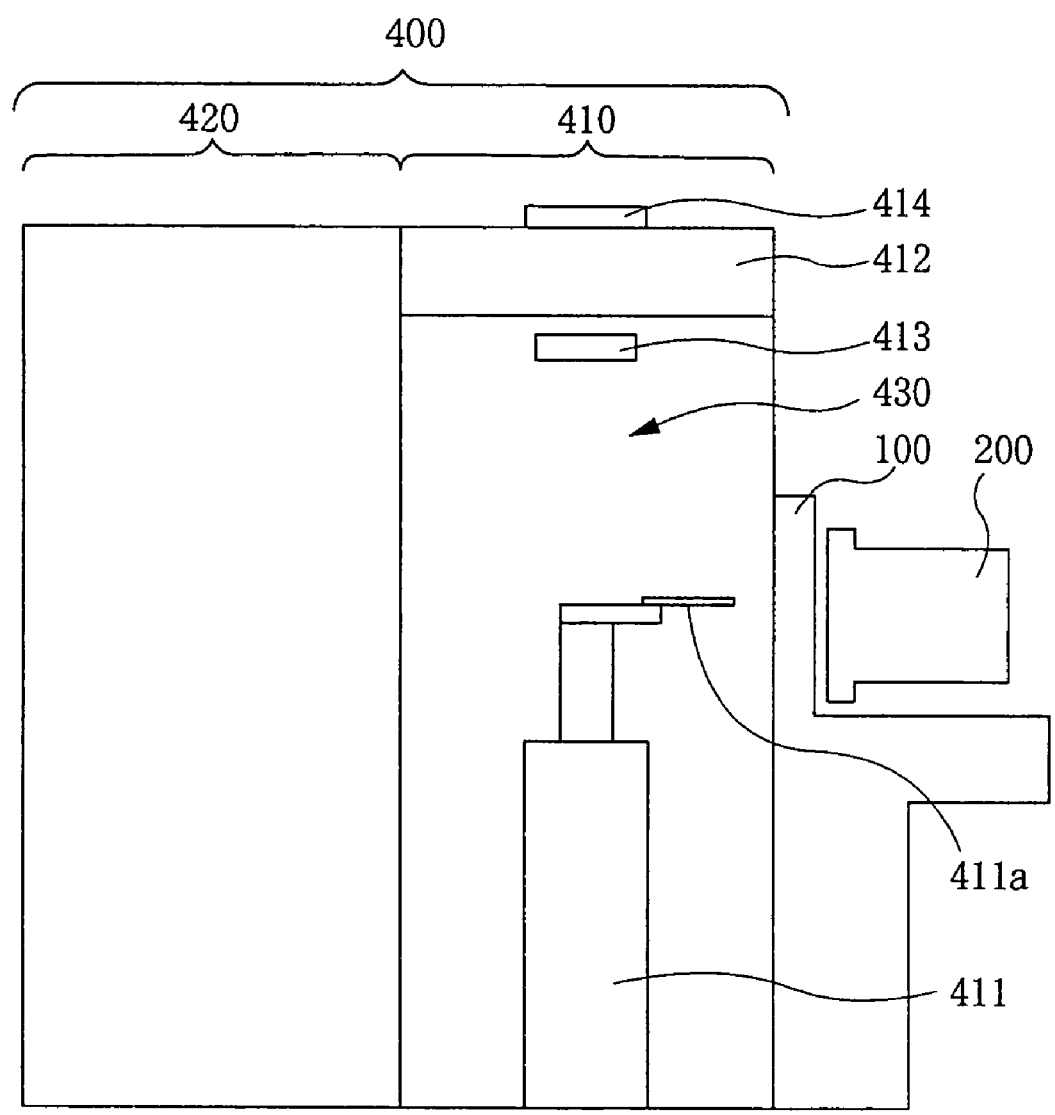
FIG. 7 is a side view showing an internal structure of a semiconductor manufacturing apparatus as a modification to the semiconductor manufacturing apparatus as shown in FIG. 4.
Figure 8:
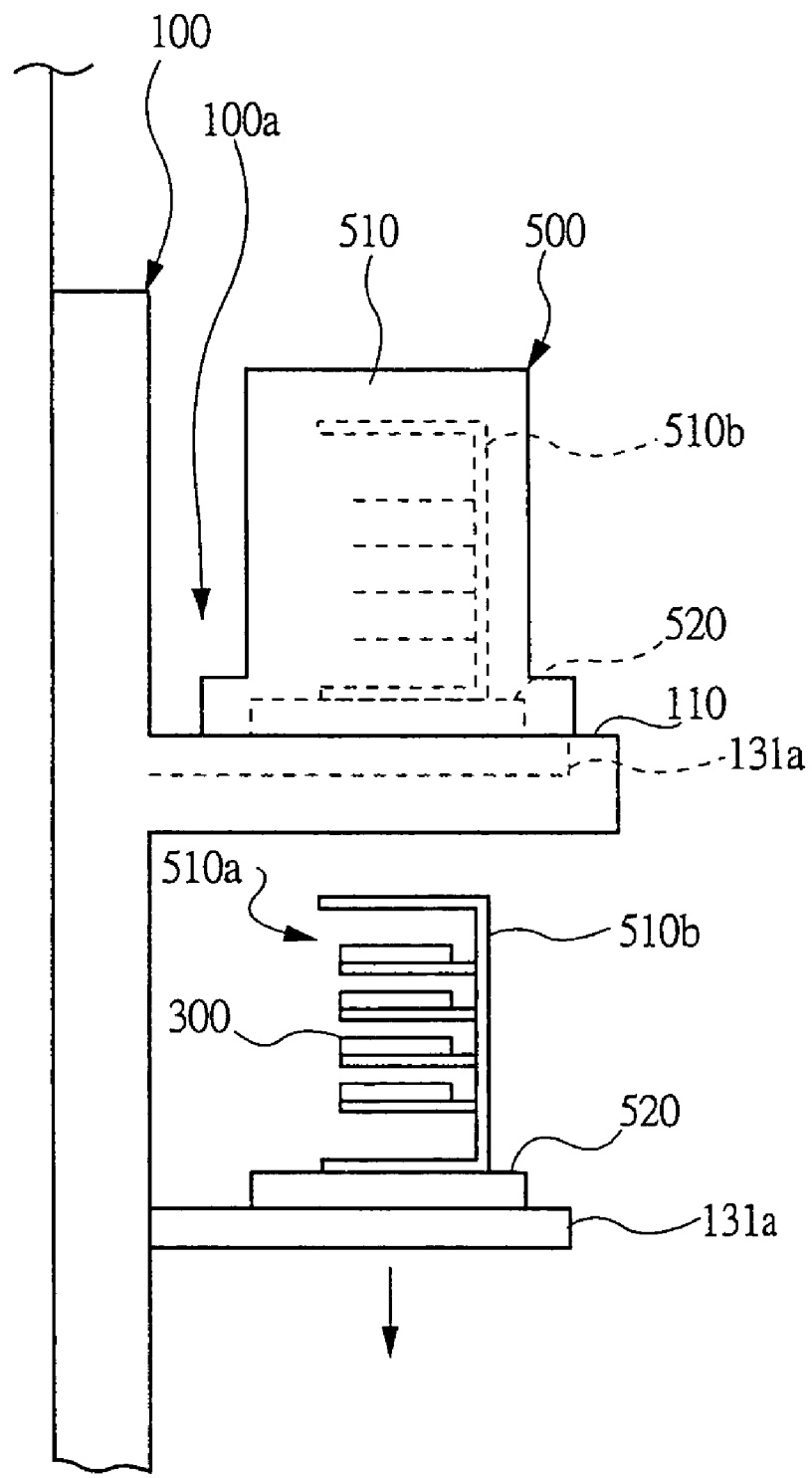
FIG. 8 is a partial side view showing an elevator operation of the semiconductor-accommodating container opening/closing apparatus using the semiconductor-accommodating container as a modification to the semiconductor-accommodating container shown in FIG. 2.

FIGS. 1A and 1B are external perspective views showing a structural example of a semiconductor-accommodating container opening/closing apparatus used for a method of manufacturing a semiconductor integrated circuit device that is embodiment 1 of the present invention. FIG. 1A shows a front side of the structure. FIG. 1B shows a rear side of the structure. FIG. 2 is a perspective view showing a structural example of a semiconductor-accommodating container (FOUP) used for the method of manufacturing a semiconductor integrated circuit device that is embodiment 1 of the present invention. FIG. 3 is a partial perspective view showing a structural example of a semiconductor manufacturing apparatus in which the semiconductor-accommodating container opening/closing apparatus shown in FIG. 1 is installed. FIG. 4 is a side view showing an internal structure of the semiconductor manufacturing apparatus shown in FIG. 3. FIG. 5 is a plan view showing an internal structure of the semiconductor manufacturing apparatus shown in FIG. 3. FIG. 6 is a sequential flowchart showing an example of a transport sequence for semiconductor substrates in the method of manufacturing a semiconductor integrated circuit device that is embodiment 1 of the present invention. FIG. 7 is a side view showing an internal structure of a modification of the semiconductor manufacturing apparatus shown in FIG. 4. FIG. 8 is a partial side view showing an operation of an elevator in the semiconductor-accommodating container opening/closing apparatus using a modification of the semiconductor-accommodating container shown in FIG. 2.

In the method of manufacturing a semiconductor integrated circuit device that is the present embodiment 1, a semiconductor-accommodating container 200 (hereafter referred to as a container 200) of a sealed type is used, and a semiconductor substrate (a semiconductor wafer) 300 accommodated therein is taken out and transported into a semiconductor manufacturing apparatus 400, and desired process treatment (for example, treatment performed in pre-treatment such as exposure, etching, sputtering, film-formation, or the like) is performed by this semiconductor manufacturing apparatus 400, and thereafter the semiconductor substrate 300 finishing the treatment thereof is accommodated in the container 200 again.

The semiconductor substrate 300 composed of a large-sized member having a diameter of 300 mm. Here, as the container 200 for accommodating this, a front-opening/closing type FOUP will be described.

With reference to FIGS. 1A and 1B and 2 to 5, a structure of the semiconductor manufacturing apparatus 400 is described, which corresponds to a mini-Environment (meaning small environment made of a sealed container for isolating products from contamination and human being) used by the method of the manufacturing the semiconductor integrated circuit device that is the present embodiment 1.

As shown in FIGS. 3, 4, and 5, the semiconductor manufacturing apparatus 400 mainly comprises a semiconductor-accommodating container opening/closing apparatus 100 (hereafter referred to as an opening/closing apparatus 100), a treatment section 420 for performing desired processes on the semiconductor substrate 300, and a transport area 410 for carrying out the semiconductor substrate 300 between a load port 100a of the semiconductor manufacturing apparatus 400 and the treatment section 420.

Further, as shown in FIGS. 1A, 1B and 2, the opening/closing apparatus 100 comprises, if roughly divided, a stage 110 for mounting the container 200 and an opener 120 for holding and opening/closing a cover 220 of the container 200. As shown in FIG. 1A, the stage 110 is provided with positioning pins 112 for accurately mounting the container 200 and a slider 111 for making the container 200 close to the opener 120.

According to this embodiment 1, the slider 111 is movable in a front-and-rear direction by means of a motor and a ball screw (not shown) provided in the stage 110. The opener 120 is provided with rotary keys 121 which can be rotated through 90° by a motor (not shown) provided inside the opener 120.

As shown in FIG. 1 B, the rear side of the opener 120 is provided with an opener opening/closing mechanism 130 and an opener rising/falling mechanism 131. The opener opening/closing mechanism 130 opens and closes the cover 220 of the container by going forward and backward the opener 120 in a horizontal direction. The opener rising/falling mechanism 131 makes the opener 120 rise and fall. The opener opening/closing mechanism 130 and the opener rising/falling mechanism 131 are both operated by a motor and a ball screw (not shown). The entire driving sections of the opener opening/closing mechanism 130 and the opener rising/falling mechanism 131 are provided with a safety cover 140 such that operators do not easily come in contact therewith.

As shown in FIG. 4, the semiconductor manufacturing apparatus 400 is divided into a transport area 410 and a treatment section 420 therein. FIG. 3 shows an example of the case where a structure that four opening/closing apparatuses 100 are installed to the semiconductor manufacturing apparatus 400.

The transport area 410 is provided with a fan filter unit 412 on an inner ceiling thereof, and clean air flows from the top thereof to the bottom in a down-flow manner. During operation of the fan filter unit 412, the transport area 410 is kept at cleanliness IS01 to IS02, and thereby can maintain a highly clean state in comparison to cleanliness IS06 outside the semiconductor manufacturing apparatus 400.

If the semiconductor substrate 300 is left putting in the environment of cleanliness IS06, foreign materials adhere to the substrate surface as time goes, and thereby a yield of semiconductor parts (semiconductor integrated circuits) formed on the semiconductor substrate 300 is remarkably decreased. The inside of the container 200 is shut out from the outside world. If the semiconductor substrate 300 is carried in or out in the highly clean environment, the cleanliness in the container is maintained. So, even if the container 200 is left putting in the environment of cleanliness IS06, a very small amount of foreign materials adheres to the semiconductor substrate 300 inside the container 200 unless the cover 220 of the container 200 is opened and closed.

FIGS. 4 and 5 schematically show an internal structure of the semiconductor manufacturing apparatus 400 that is the present embodiment 1. The transport area 410 is provided with the fan filter unit 412 on the internal ceiling, a transport robot 411, and an alignment section 415 shown in FIG. 5. The transport robot 411 transfers the semiconductor substrates 300 between the container 200 on the load port 100a and a load lock chamber 421 in the treatment section 420. The alignment section 415 adjusts the position (direction) of the semiconductor substrate 300 when the semiconductor substrate 300 is transferred to the load lock chamber 421.

Further, an ionizer 413 as a static eliminator is provided at the bottom of the fan filter unit 412 in the transport area 410. The ionizer 413 static-eliminates the semiconductor substrate 300 which is in transportation or wait in the transport area 410, and static-eliminates the semiconductor substrate 300 in the container 200 put in the load port 100a.

That is, the semiconductor substrate 300 is static-eliminated when being carried in the load lock chamber 421 of the treatment section 420, or when being returned to the container 200 after processes are performed in the treatment section 420, or during waiting in the load lock chamber 421, an unload lock chamber 422 or the alignment section 415, or when is accommodated in the container 200 on the load port 100a. The ionizer applies ionized gas to the semiconductor substrate 300 and properly maintains electric potential of the semiconductor substrate 300.

This can static-eliminate the semiconductor substrate 300 which is before-process and after-process in transportation within the transport area 410, or which is in waiting at the load lock chamber 421, the unload lock chamber 422 and the alignment section 415, or which is accommodated in the container 200, and can properly keep potential of the semiconductor substrate 300.

The treatment section 420 is provided with a treatment chamber 423 for performing process at the semiconductor substrate 300. Between the treatment chamber 423 and the transport area 410, there are provided the load lock chamber 421 and the unload lock chamber 422 which can be sealed by gate valves 421a and 422a.

The load lock chamber 421 is provided with substrate supporting stands 421b in FIG. 4, by which the semiconductor substrate 300 is made to wait and can be supported. The unload lock chamber 422 is also provided with not shown members similar to the substrate supporting stands 421b.

Nonconductive resin coating is applied to such contact portions that a robot hand 411a of the transport robot 411 installed in the transport area 410 is in contact with the semiconductor substrate 300. Nonconductive resin coating is also applied to such contact portions that the substrate supporting stands 421b are in contact with the semiconductor substrate 300.

Therefore, while the robot hand 411a or each substrate supporting stand 421b is supporting the semiconductor substrate 300, its potential does not become 0 V.

Consequently, it is very effective to static-eliminate the semiconductor substrate 300 by providing the transport area 410 with the ionizer 413.

The following describes the structure of the container 200 used for the method of manufacturing the semiconductor integrated circuit device that is the present embodiment 1.

The container 200 shown in FIG. 2 is a sealed type and comprises a container body 210 (container section) and the cover 220 (container cover section). The container body 210 has four latch grooves 211 and a flange 212 provided around an opening 210a of the container body 210.

The container body 210 has an opening portion 210a formed by opening a first face at a front surface side thereof. The container body 210 includes a substrate holding section 210b which functions as a shelf for horizontally accommodating the semiconductor substrate 300. For example, the container body 210 can accommodate twenty-five semiconductor substrates 300.

On the other hand, the cover 220 maintains a sealed state by coming in close contact with the container body 210 at a peripheral portion of the above-mentioned first surface.

The cover 220 has key grooves 221 (keyhole portion) at positions corresponding to the rotary keys 121 of the opening/closing apparatus 100. When the rotary keys 121 of the opening/closing apparatus 100 are inserted into the key grooves 221 and are rotated up to an angle of 90°, four latches 222 provided with the cover 220 project or withdraw from the cover 220 by means of a cam mechanism (not shown) in the cover 220. At this time, the latches 222 are positioned to correspond to the latch grooves 211 of the container body 210. With the cover 220 inserted into the container body 210, if the latches 222 is made to project from the periphery of the cover 220, the cover 220 can be fixed to the container body 210.

The container 200 has a double structure comprising an external shell portion and an inside portion. That is, the inside portion is provided with substrate holding sections 210b being in contact with the semiconductor substrate 300, and is made by conductive materials so that the semiconductor substrate 300 is set to have a potential of 0 V. The above-mentioned external shell is made by nonconductive materials.

The container 200 is not necessarily limited to the double structure, and may be a single structure that is integrally made by conductive materials as a whole. Although contact portions coming in contact with at least the semiconductor substrate 300 are preferably formed by conductive materials, the entire thereof may be formed by nonconductive materials.

Moreover, the conductive materials are, for example, resin materials containing carbon particles or the like, and polycarbonate or the like is used as the above-mentioned resin materials.

When the conductive materials are used, surface resistivity R (Ω) of the container 200 has an optimum range of $1 \times 10^6 \leq R \leq 1 \times 10^9$, an appropriate range of $1 \times 10^5 \leq R \leq 1 \times 10^{13}$, and an allowable range of $1 \times 10^4 \leq R \leq 1 \times 10^{14}$.

In the container 200, these conductive materials are portions being in contact with the semiconductor substrate 300 which is a wafer. However, the entire container 200 may be formed by these conductive materials.

Next, opening and closing operations of the container 200 will be described, which is used in the method of manufacturing the semiconductor integrated circuit device that is the present embodiment 1.

First, described is an operation for opening the sealed type container 200. The container 200 (first semiconductor-accommodating container) is placed on the stage 110. The slider 111 on the stage 110 is then moved in parallel at a side of the semiconductor manufacturing apparatus 400. Each rotary key 121 (key section) on a connection surface 120a of the opener 120 for the opening/closing apparatus 100 is inserted into each key groove 221 (keyhole section) in an exposed surface 220a of the cover 220 for the container 200.

With this state, by rotating each rotary key 121 at 90° clockwise relative to the container 200, each key groove 221 in the cover 220 rotates and the cover 220 is fitted to the opener 120. At the same time, by cam mechanism (not shown) inside the cover 220, each latch 222 is accommodated inside the cover 220.

Then, by horizontally moving the opener opening/closing mechanism 130 in a side of the semiconductor manufacturing apparatus 400, the cover 220 of the container 200 is detached from the container body 210. Then, by the opener rising/falling mechanism 131 the opener 120 is made to fall.

On the other hand, an operation for closing the container 200 is executed, contrary to the above-mentioned opening operation, by making the opener rising/falling mechanism 131 rise and by horizontally moving opener opening/closing mechanism 130 in a side of the stage 110, the cover 220 fitted to the opener 120 is connected to the container body 210.

Thereafter, by rotating each rotary key 121 at 90° counterclockwise, each latch 222 of the cover 220 is accommodated in each latch groove 211 and the cover 220 is fitted into the container body 210

Finally, the slider 111 is moved in parallel at an opposite side of the semiconductor manufacturing apparatus 400 and a state is formed in which the container 200 is detached from the stage 110.

Next, by using FIGS. 1 to 6, a sequence for carrying in or out the semiconductor substrate 300 to/from the semiconductor manufacturing apparatus 400 in the method of manufacturing the semiconductor integrated circuit device that is the present embodiment 1 will be described in accordance with a sequence flowchart shown in FIG. 6.

First, as shown at step S1 in FIG. 6, the first sealed type. container 200 accommodating a plurality of semiconductor substrates 300 (semiconductor substrates 300 of (A) shown by FIG. 5) is set on the load port 100a of the semiconductor manufacturing apparatus 400.

Since contact portions being in contact with the semiconductor substrate 300 such as at least the substrate holding section 210b or the like in the container 200 are made by conductive materials, the semiconductor substrate 300 accommodated in the container 200 is grounded to the opening/closing apparatus 100 via the container 200. Therefore, the semiconductor substrate 300 in the container 200 on the load port 100a has a potential of almost 0 V.

Namely, a plurality of semiconductor substrates 300 is accommodated in the sealed type container 200 with the semiconductor substrates 300 grounded.

Then, the cover 220 of the container 200 is opened by the opener 120 of the opener rising/falling mechanism 131 for the opening/closing apparatus 100 installed on the semiconductor manufacturing apparatus 400.

Here, a local cleaning chamber 430 having the transport area 410 has a surface 150a (front surface portion) of a surface plate 150 for the opening/closing apparatus 100. The surface 150a comes in contact with or closely faces the first face of the first sealed type container 200. There is formed an opening portion 150b (connection opening portion) in this surface 150a.

The opener 120 is provided so as to cover the opening 150a and has the rotary keys 121 (key section) which connect to the key grooves 221 under a projected state.

With each rotary key 121 (key section) of the opener 120 inserted into each key groove 221 (keyhole section) of the cover 220 in the FOUP, an unlocking operation is executed. Thereafter, with the cover 220 held by the opener, the opener 120 is introduced into the local cleaning chamber 430.

By keeping the cleanliness, the internal space of the container 200 is linked to the local cleaning chamber 430 provided with the transport area 410 for the semiconductor manufacturing apparatus 400 (first wafer treatment apparatus).

Thereafter, under a linking state described above, the transport robot 411 carries the semiconductor substrate 300 accommodated in the container 200. The transport robot 411 is a transport mechanism provided in the transport area 410 of the local cleaning chamber 430.

The robot hand 411a (contact section) of the transport robot 411 installed in the transport area 410 holds (seizes) the semiconductor substrate 300 and take it out from the container 200. After the semiconductor substrate 300 is introduced in the transport area 410, the transport robot 411 moves the semiconductor substrate 300 (semiconductor substrate 300 of (B) shown in FIG. 5) to the alignment section 415 (Step S2).

Since the container 200 in this embodiment is a front opening/closing type FOUP, the cover 220 is vertically moved relative to an opening surface of the container 200 by the opener 120 and thereby is opened.

Moreover, since nonconductive resin coating is applied to contact portions between the robot hand 411a of the transport robot 411 and the semiconductor substrate 300, the semiconductor substrate 300 is ungrounded while being held by the robot hand 411a. Namely, the semiconductor substrate 300 does not have a potential of 0 V while being transported by the transport robot 411.

However, in the semiconductor manufacturing apparatus 400 that is the present embodiment 1, since the ionizer 413 is provided in the transport area 410, static elimination of the ionizer 413 can prevent the semiconductor substrate 300 in the transport area 410 from being charged and the robot hand 411a of the transport robot 411 too can be static-eliminated.

Thereafter, alignment (adjustment of direction and position) of the semiconductor substrate 300 is executed by the alignment section 415. Static elimination can be executed by the ionizer 413 since the alignment section 415 is also linked to the transport area 410.

After the alignment, the transport robot 411 takes the semiconductor substrate 300 from the alignment section 415. The transport robot 411 transports the semiconductor substrate 300 to the load lock chamber 421 (Step S3). The substrate supporting stands 421b of the load lock chamber 421 as shown in FIG. 4 support the semiconductor substrate 300 (semiconductor substrate 300 of (C) shown in FIG. 5).

Since nonconductive resin coating is applied to contact portions between the semiconductor substrate 300 and the substrate supporting stands 421b, the semiconductor substrate 300 does not have a potential of 0 V in the load lock chamber 421, similarly to the case where it is transported by the above-mentioned transport robot 411. However, static elimination is executed by the ionizer 413 because the load lock chamber 421 is also linked to the transport area 410. At this time, it is also possible to static-eliminate the substrate supporting stands 421b.

Accordingly, static elimination executed by the ionizer 413 can prevent the semiconductor substrate 300 even in the load lock chamber 421 from being charged.

Thereafter, the gate valve 421a of the load lock chamber 421 is closed to decompress the load lock chamber 421. Pressure of the load lock chamber 421 is equalized to that of the treatment chamber 423 inside the treatment section 420 (first wafer treatment section).

After the load lock chamber 421 is decompressed, the gate valve 421a in a side of the treatment chamber 423 is opened. A robot (not shown) provided in the treatment chamber 423 transports the semiconductor substrate 300 to the treatment chamber 423 (Step S4).

Then, in the treatment chamber 423, a desired process treatment (first treatment) is executed at the semiconductor substrate 300 (semiconductor substrate 300 of (D) shown in FIG. 5).

After the process treatment, the above-mentioned robot in the treatment chamber 423 transports the semiconductor substrate 300 into the decompressed unload lock chamber 422 (Step S5).

Similarly to the case of the load lock chamber 421, the semiconductor substrate 300 (semiconductor substrate 300 of (E) shown in FIG. 5) does not have a potential of 0 V in the unload lock chamber 42. Therefore, static elimination can executed by the ionizer 413 since the unload lock chamber 422 and the transport area 410 are linked to each other.

Thereafter, the gate valve 422a of the unload lock chamber 422 is closed to pressurize the unload lock chamber 422 up to normal pressure. After the pressurization, the gate valve 422a in a side of the transport area 410 is opened. The transport robot 411 in the transport area 410 transports the process-treated semiconductor substrate 300 from the unload lock chamber 422 to the transport area 410 (Step S6).

Further, this semiconductor substrate 300 is transported into the container 200 (container 200 located at a lower side in FIG. 5) on the load port 100a. In this manner, the process-treated semiconductor substrates 300 are sequentially returned to the original container 200 (Step S7).

The ionizer 413 in the transport area 410 can static-eliminate the semiconductor substrate 300 in which process treatment has been performed by the robot hand 411a during transportation, or the semiconductor substrate 300 (the semiconductor substrate 300 of (A) shown in FIG. 5) which is accommodated in the container 200.

Namely, with the semiconductor substrate 300 grounded, the semiconductor substrate 300 is accommodated in the container 200.

After the process treatment is completed for all semiconductor substrates 300 accommodated in the container 200 shown in the lower side of FIG. 5 and these semiconductor substrates are accommodated in the original container 200, the opener opening/closing mechanism 130 shown in FIG. 1B closes the cover 220 of the container 200, and releases a linking state between the container 200 (first semiconductor-accommodating container) and the local cleaning chamber 430.

This returns the container 200 to the sealed state.

This container 200 is transported to a predetermined location of the semiconductor manufacturing apparatus 400 for the next step (Step S8).

The process treatment of the semiconductor substrates 300 in the treatment section 420 of the semiconductor manufacturing apparatus 400 is performed by a single wafer treatment.

Further, a transporting sequence of the semiconductor substrate 300 from step SI to step S8 is a sequence for one semiconductor substrate 300 predetermined. However, for example, while the above-mentioned one semiconductor substrate 300 predetermined is process-treated in the treatment section 420 (semiconductor substrate 300 of (D) shown in FIG. 5), the other semiconductor substrates 300 before the process treatment are subsequently waiting in the load lock chamber 421 (semiconductor substrate 300 of (C) shown in FIG. 5), the alignment section 415 (semiconductor substrate 300 of (B) shown in FIG. 5), and the container 200 (semiconductor substrate 300 of (A) shown in FIG. 5).

Next, modifications of the present embodiment 1 shown in FIGS. 7 and 8 will be described below.

FIG. 7 shows a modification of the semiconductor manufacturing apparatus 400, and the modification has such a structure that the transport area 410 and the treatment section 420 are directly linked without linking the load lock chamber 421 or the unload lock chamber 422 therebetween. Even in this case, it is possible to static-eliminate the semiconductor substrate 300 (see FIG. 2) before and after the process treatment by installing the ionizer 413 in the transport area 410.

the semiconductor manufacturing apparatus 400 shown in FIG. 7 is provided with a chemical filter 414 on the fan filter unit 412 of the transport area 410. By this, chemical contamination of the semiconductor substrate 300 can be avoided.

FIG. 8 illustrates an operation of the opening/closing apparatus 100 when a modified semiconductor-accommodating container 500 (hereafter referred to as a container 500) is used.

That is, the container 500 is not a bottom opening/closing type but a front opening/closing type. This container comprises a container body 510, a cover 520, and a substrate holding section 510b. When this is set on the cover 520 of the opening/closing apparatus 100, the cover 520 is set downward.

Therefore, when the opener opening/closing mechanism 130 of the opening/closing apparatus 100 shown in FIG. 1 opens or closes the container 500, the opener rising/falling mechanism 131 makes an elevator 131a shown in FIG. 8 lower or raise, and makes the substrate holding section 510b exposed from the container 500. Thereby, the semiconductor substrates 300 is carried in or out through the opening portion 510a of the substrate holding section 510b.

Accordingly, even the bottom opening/closing type container 500 can be applied similarly to the front opening/closing type container 200.

According to the method of manufacturing the semiconductor integrated circuit device that is the present embodiment 1, the semiconductor-accommodating container may be a front opening/closing type or a bottom opening/closing type in the case of a sealed type.

The method of manufacturing the semiconductor integrated circuit device that is the present embodiment 1 will have operations and effects as follows.

That is, the ionizer 413 static-eliminates the semiconductor substrate 300 process-treated by the treatment section 420 in the transport area 410 between the load port 100a of the semiconductor manufacturing apparatus 400 and the treatment section 420. Being accommodated in the container 200 on the load port 100a can eliminates electric charges from the semiconductor substrate 300 charged.

Therefore, it is possible to decrease amounts of foreign materials adhering to the semiconductor substrate 300 and to improve a yield thereof.

Further, it is also possible to static-eliminate contact portions (regions) being in contact with the semiconductor substrate 300, for example, the robot hand 411a, the substrate supporting stands 421b of the load lock chamber 421, or the like. Consequently, it is possible to eliminate potential difference between the semiconductor substrate 300 and the semiconductor substrate contact portions.

Therefore, it is possible to reduce disadvantages of handling errors caused by the semiconductor substrate 300 charged, and transporting errors of semiconductor substrate 300, and the like.

As a result, it is possible to improve reliability for transporting the semiconductor substrate 300 and an operating ratio of the semiconductor manufacturing apparatus 400.

Since electric charge can be eliminated from the semiconductor substrate 300 charged, it is possible to decrease a damage to the semiconductor substrate 300 due to a discharge and consequently improve a yield of the semiconductor substrate 300.

The following describes a speed for opening and closing the cover 220 of the container 200.

When the semiconductor substrate 300 (semiconductor wafer) is transported from the container 200 to the semiconductor manufacturing apparatus 400 or from the semiconductor manufacturing apparatus 400 to the container 200, the semiconductor manufacturing apparatus 400 and the container 200 are connected via the opening/closing apparatus 100. Therefore, by opening and closing the cover 220 of the container 200, a clean area inside the semiconductor manufacturing apparatus 400 and a clean area inside the container 200 are directly connected to each other.

At this time, internal pressure of the semiconductor manufacturing apparatus 400 is slightly set to be positive pressure in comparison to the outside world. Except for moments when the container 200 is opened and closed, there is a little possibility that foreign materials enter a gap between a flange 211 of the container 200.and the surface plate 150 of the opening/closing apparatus 100.

However, if the opener opening/closing mechanism 130 of the opening/closing apparatus 100 has high speed of the operation thereof, the inside of the container 200 becomes negative pressure at moments when the cover 220 is pulled out of the container body 210. Consequently, foreign materials enter the inside of the container 200 through a gap between the flange 211 of the container 200 and the surface plate 150 of the opening/closing apparatus 100 and adhering to the semiconductor substrate 300.

The opening/closing speed of the cover 220 is disclosed in PCT application number PCT/JP00/05012 (international filing date Jul. 27, 2000) by the inventors in detail.

(Embodiment 2)

Figure 9:
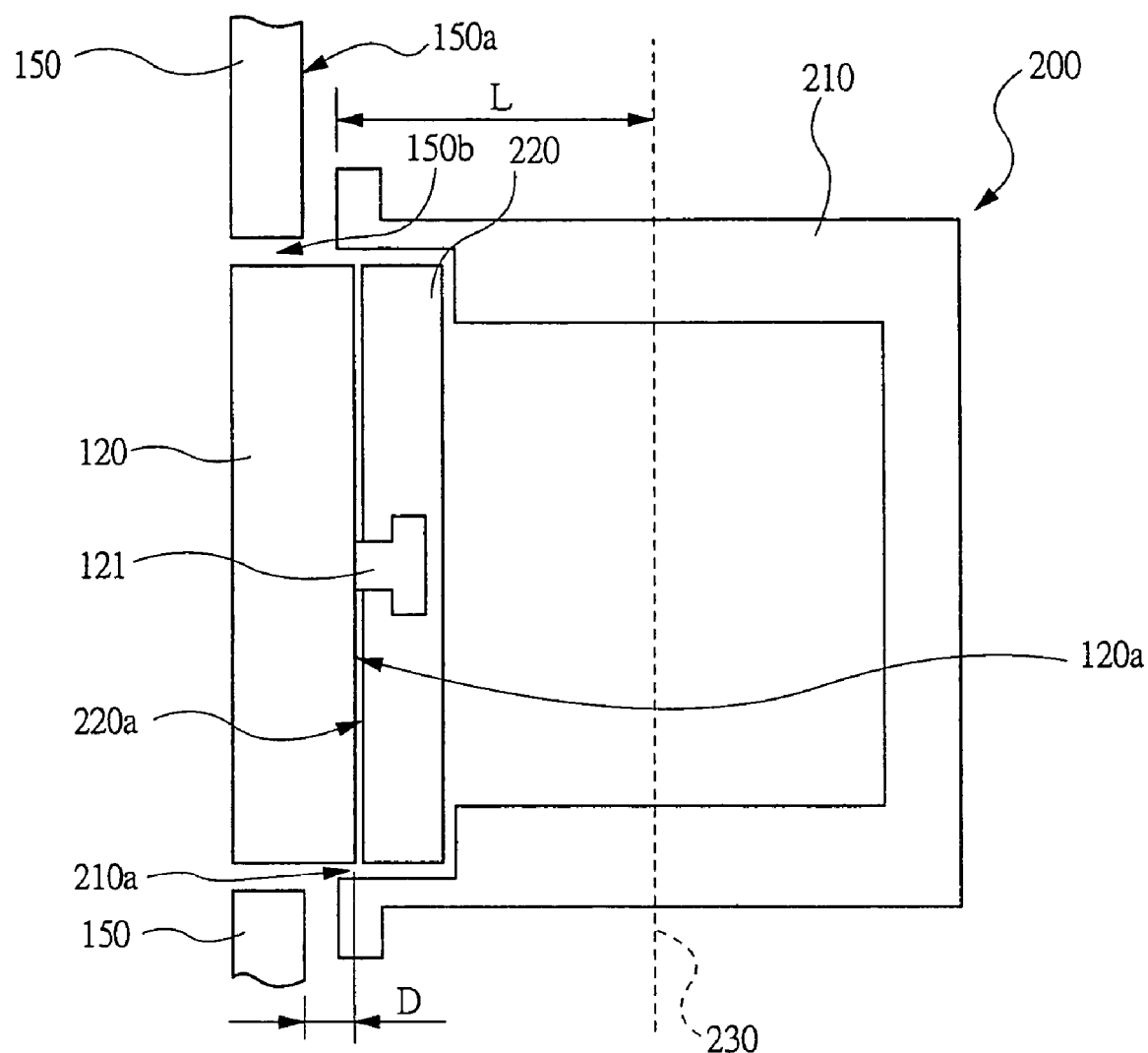
FIG. 9 is a partial plan view showing an example of a step between an opener's connection surface and a surface plate's surface used for the method of manufacturing a semiconductor integrated circuit device according to embodiment 2 of the present invention.
Figure 10:
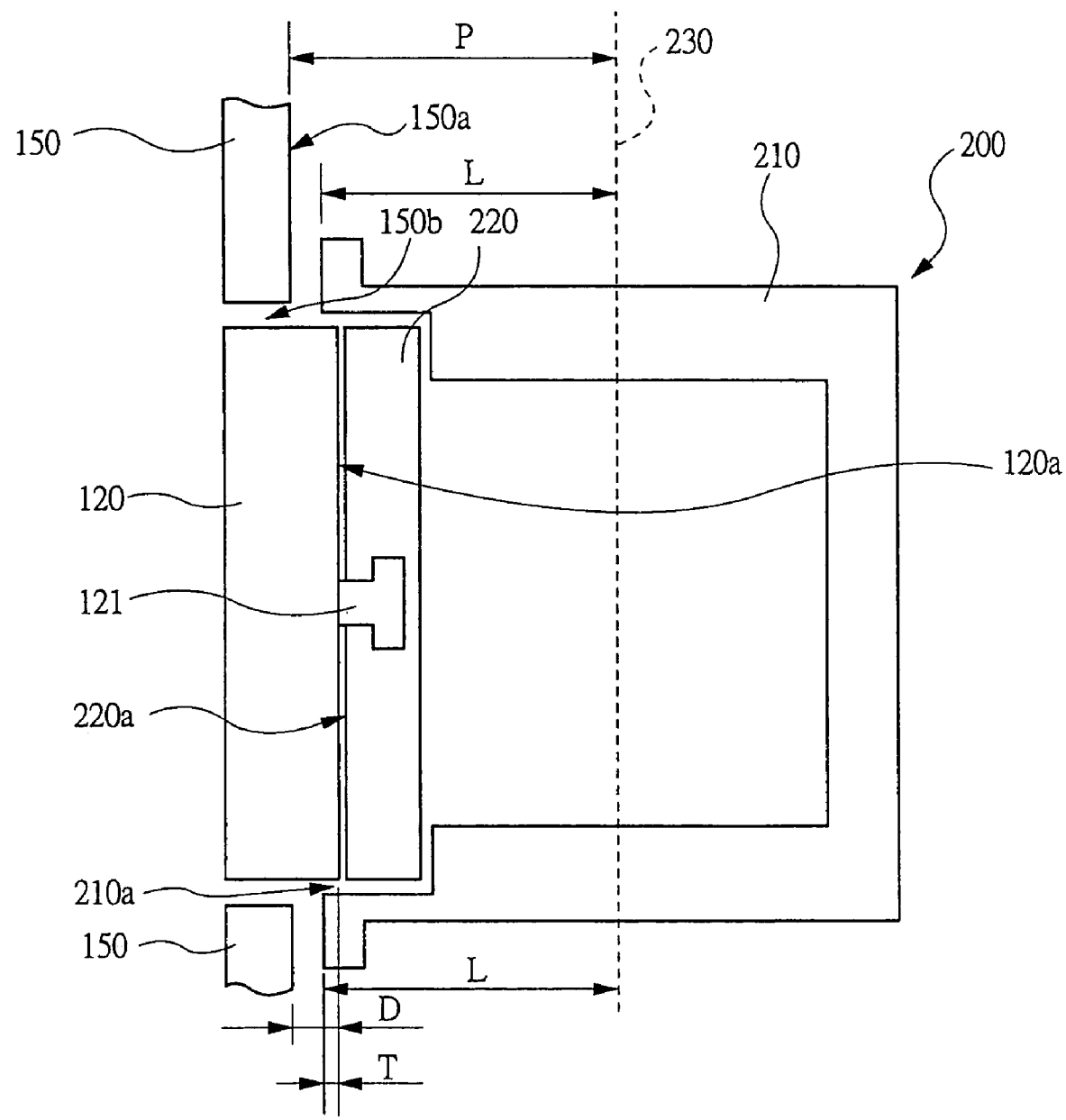
FIG. 10 is a partial plan view showing an example of an overlap amount between an opener's connection surface and a semiconductor-accommodating container's exposed surface in the semiconductor-accommodating container opening/closing apparatus according to embodiment 2 of the present invention.
Figure 11:
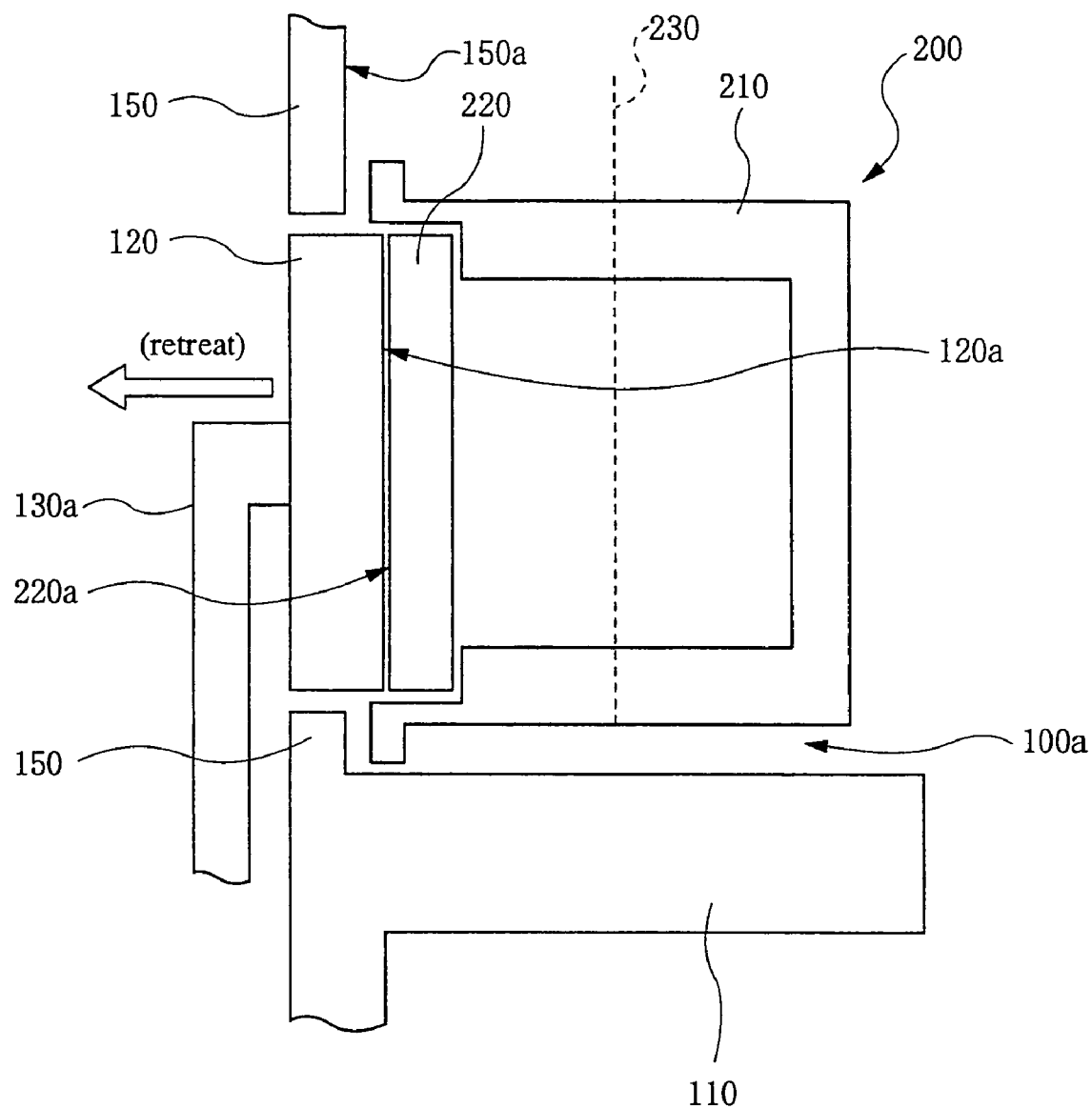
FIG. 11 is a partial side view showing an example of holding the opener of the semiconductor manufacturing apparatus in FIG. 10.
Figure 12:
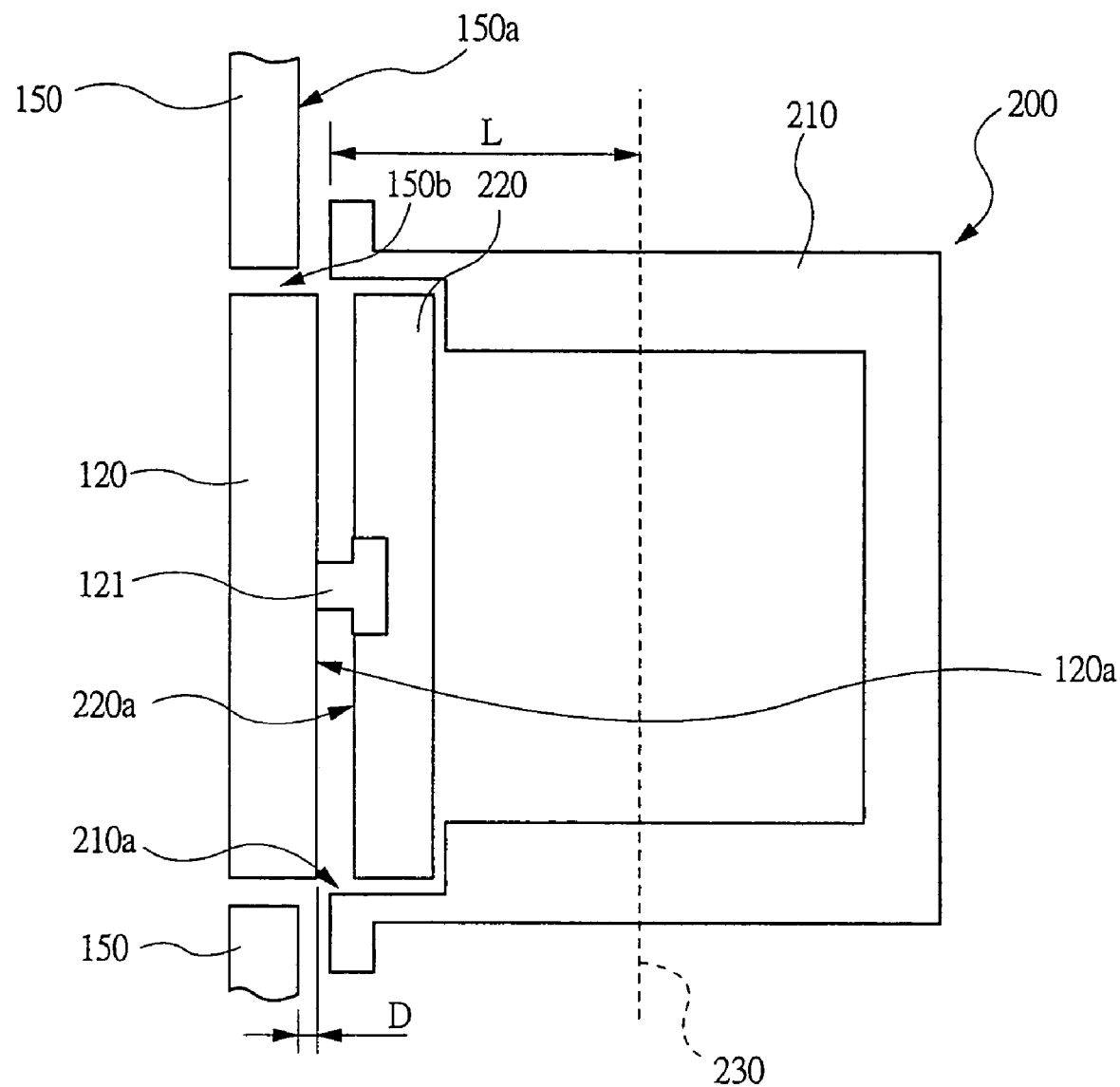
FIG. 12 is a partial plan view showing relationship between the semiconductor-accommodating container opening/closing apparatus and the semiconductor-accommodating container in the comparative example for embodiment 2.

FIG. 9 is a partial plan view showing an example of a step between a connection surface of an opener and a surface of a surface plate in a substrate accommodating container opening/closing apparatus used by a method of manufacturing a semiconductor integrated circuit device that is embodiment 2 of the present invention. FIG. 10 is a partially plan view showing an example of amounts of overlap between a connection surface of an opener and an exposed surface of a semiconductor-accommodating container in a substrate accommodating container opening/closing apparatus that is the embodiment 2 of the present invention. FIG. 11 is a partial side view showing an example of holding the opener of the semiconductor manufacturing apparatus shown in FIG. 10.

The method of manufacturing a semiconductor integrated circuit device that is the present embodiment 2 uses the container 200 shown in FIG. 2, that is a FOUP, which is a sealed type described in the embodiment 1 and a front-opening/closing type, and carries in or out the semiconductor substrate 300 having the diameter of 300 mm to or from the semiconductor manufacturing apparatus 400. At this time, said method explains a positional relation between the cover 220 of the container 200 and the connection surface 120a of the opener 120 for the opening/closing apparatus 100 installed in the semiconductor manufacturing apparatus 400.

With respect to the container 200, a container length L shown in FIG. 9 (the container length L is a length between a facial reference surface 230 of the container 200 and an end portion of container body 210 in a front surface side of the container, or between a facial reference surface 230 and an exposed surface 220a of the cover 220) provides that if the container length is (y33), y33=165.5±0.5 mm under the SEMI standards E47.1 and E62. Namely, the container length L is set to be L=165.5 mm±0.5 mm.

Further, the same standards provides that a side of the load port 100a is also set to be y33=165.5±0.5 mm.

About the step D between the connection surface 120a of the opener 120 for the opening/closing apparatus 100 and the surface 150a of the surface plate 150, the SEMI standard E62 provides that tolerance (y34) thereof is set to be y34=±0.25 mm.

In the present embodiment 2, the step D between the connection surface 120a of the opener 120 and the surface 150a of the surface plate 150, that is, projecting amounts from the surface 150a of the surface plate 150 of the connection surface 120a of the opener 120 is set to be longer than 0.25 mm. Namely, the connection surface 120a of the opener 120 is projected from the surface 150a of the surface plate 150 over 0.25 mm.

Moreover, the connection surface 120a of the opener 120 is projected from the surface 150a of the surface plate 150 over 0.3 mm (namely, the above-mentioned projecting amounts are set to be longer than 0.3 mm).

The above-mentioned projecting amounts depend on a virtual stop position (based on servo control, etc.) of the opener 120 in the case of no FOUP (container 200).

Optimally, the projecting amounts are 1.0 mm. An appropriate range is 0.7 mm<projecting amounts. A preferable range is 0<projecting amounts<10 mm.

By setting the projecting amounts to the optimum value of 1.0 mm, it is possible to provide the opening/closing apparatus 100 which is reliably opening/closing possible even if the container length L has the minimum value of 165 mm.

About projecting amounts from the surface 150a of the surface plate 150 of the connection surface 120a of the opener 120, when the container 200 is set on the load port 100a, the opener 120 supported by an opener supporting portion 130a cantilevered as shown in FIG. 11 retreats inside the apparatus, by moving in parallel at a side of the semiconductor manufacturing apparatus 400.

As shown in FIG. 11, the opener 120 is supported by the opener support 130a (cantilever beam). When the container 200 is positioned to the load port 100a, the opener 120 supported by an opener supporting portion 130a cantilevered as shown in FIG. 11 retreats inside the apparatus, by moving in parallel at a side of the semiconductor manufacturing apparatus 400. The projecting amounts may be preferably within a range capable of horizontally operating the opener 120.

In the method of manufacturing the semiconductor integrated circuit device that is the present embodiment 2, under the condition that such the step D (above-mentioned projecting amounts) is set, the semiconductor substrate 300 is carried in or out.

First, the full state container 200 (first semiconductor-accommodating container) accommodating a plurality of semiconductor substrates 300 therein is located on the stage 110 of the opening/closing apparatus 100 shown in FIG. 1.

At this time, a front surface which is a first surface of the container 200 is come in contact with or closely faced at the surface 150a of the surface plate 150 of the opening/closing apparatus 100 of the local cleaning chamber 430 such that the rotary keys 121 of the opener 120 are inserted into the key grooves 221 of the cover 220 of the container 200.

Thereafter, the connection surface 120a of the opener 120 is put into contact with the exposed surface 220a of the cover 220 to hold (seize) the cover 220 by the opener 120.

At this time, the connection surface 120a (front portion) of the opener 120 is maintained so as to project over 0.25 mm from the surface 150a of the surface plate 150 in the case where the container 200 is not provided.

Consequently, since the connection surface 120a of the opener 120 projects from the surface 150a of the surface plate 150, the connection surface 120a of the opener 120 is closely and certainly contact with the exposed surface 220a of the cover 220 of the container 200.

Thereafter, the opener 120 vertically moves the cover 220 relative to the opening surface of the container 200 to open the cover 220. This connects the opening 210a of the container 200 and the opening 150b of the surface plate 150 for the opening/closing apparatus 100 to each other.

Subsequently, the semiconductor substrate 300 is carried in or out from the container between the container 200 and the semiconductor manufacturing apparatus 400 via the opening 210a of the container 200 and the opening 150b of the opening/closing apparatus 100.

An overlap amount T in FIG. 10 is set to 0<T≦1.25 mm in order to ensure a contact between the opener 120 and the cover 220 when the cover 220 of the container 200 is opened and closed.

The overlap amount T corresponds to an overlap between the container length L of the container 200 and the projection amount (Step D) from the surface 150a of the surface plate 150 for the opener 120.

According to the above-mentioned SEMI standard, the container length L is assumed to be y33 and is specified as y33=165.5±0.5 mm. On the side of the load port 100a, a distance P from the facial reference surface 230 during docking to the surface 150a of the surface plate 150 is assumed to be y33 and is specified as y33=165.5±0.5 mm. There is the step D between the connection surface 120a of the opener 120 for the opening/closing apparatus 100 and the surface 150a of the surface plate 150. This step's tolerance is assumed to be y34 and is specified as y34=±0.25 mm in the above-mentioned SEMI standard.

The maximum overlap amount T is a sum of maximum tolerances for the container length L, the distance P, and the step D, and results in T=1.25 mm. The maximum overlap amount T is a sum of minimum tolerances for these values and results in T=−1.25 mm. This means generation of a 1.25 mm gap between the opener 120 and the cover 220.

The method of manufacturing the semiconductor integrated circuit device according to embodiment 2 requires contact between the opener 120 and the cover 220. The overlap amount T is at least T>0. An allowable range of the overlap amount T is 0<T≦1.25 mm.

Accordingly, the overlap amount T (mm) needs to be T>0 for all containers 200 operating on the semiconductor manufacturing line. A desirable range is 0<T≦1.25 for all containers 200 operating on the semiconductor manufacturing line.

Actually, it is difficult for all containers 200 operating on the semiconductor manufacturing line to satisfy the condition of T>0. Accordingly, it is desirable to keep a percentage of incomplete contact between the connection surface 120a of the opener 120 and the exposed surface 220a of the cover 220 to be 1% or less for all containers 200 operating on the semiconductor manufacturing line.

However, a percentage of incomplete contact between the opener 120 and the cover 220 may exceed 1% of all containers 200 operating on the semiconductor manufacturing line.

The method of manufacturing the semiconductor integrated circuit device according to embodiment 2 provides the following advantageous effects.

Namely, the connection surface 120a of the opener 120 is made to project from the surface 150a of the surface plate 150 for the opening/closing apparatus 100 installed on the semiconductor manufacturing apparatus 400. Thus, it is possible to ensure contact between the connection surface 120a of the opener 120 and the cover 220 of the container 200 when the cover 220 of the container 200 is opened and closed.

Accordingly, it is possible to decrease damages to the container 200, prevent dust generation, and extend an endurance period of the container 200.

Since the connection surface 120a of the opener 120 can contact with the cover 220 of the container 200, it is possible to reliably open and close the cover 220, preventing a foreign materials from adhering to the semiconductor substrate 300.

The use of the ionizer 413 according to embodiment 1 can improve the reliability for carrying the semiconductor substrate 300 and opening and closing the cover 220 of the container 200. Hence, it is possible to prevent a decrease in the operating ratio of the semiconductor manufacturing apparatus 400 on the entire semiconductor manufacturing line.

While there have been described the present invention by the inventors based on specific preferred embodiments 1 and 2, it is to be distinctly understood that the present invention is not limited to embodiments 1 and 2. It is further understood by those skilled in the art that various changes and modifications may be made in the present invention without departing from the spirit and scope thereof.

The semiconductor manufacturing apparatus 400 described in embodiments 1 and 2 is not limited to pre-processes. The apparatus may be an inspection apparatus or a wafer sorter which does not directly conduct manufacture on the semiconductor substrate 300. Also in this case, it is possible to provide same effects as for embodiments 1 and 2.

The following summarizes advantageous effects obtained by major aspects of the present invention disclosed in the application concerned.

(1) A yield of semiconductor substrates can be improved.

(2) An operating ratio of the semiconductor manufacturing apparatus can be improved.

What is claimed is:

1. A method of manufacturing a semiconductor integrated circuit device, comprising the steps of:
    (a) linking an internal space of a sealed type semiconductor-accommodating container which accommodates and is filled with a plurality of wafers grounded, to a local clean chamber of a first wafer treatment apparatus with cleanliness kept in internal space of said local clean chamber;
    (b) transporting said wafers accommodated in said sealed type semiconductor-accommodating container under said linking state by means of a transport mechanism disposed in said local clean chamber through said local clean chamber, and thereby accommodating the wafers in a wafer treatment section of said first wafer treatment apparatus through a load lock and unload lock mechanism disposed between said wafer treatment section and said local clean chamber;
    (c) performing a first treatment to said wafers accommodated in said wafer treatment section;
    (d) after step (c), transporting treated wafers by said transport mechanism through said load lock and unload lock mechanism from said wafer treatment section, and thereby accommodating said treated wafers grounded in said sealed type semiconductor-accommodating container through said local clean chamber;
    (e) eliminating static charge of said treated wafers in step (d); and
    (f) releasing the linking state between said sealed type semiconductor-accommodating container and said local clean chamber after said step (d), and thereby returning said sealed type semiconductor-accommodating container to a sealed state.

2. The method of manufacturing a semiconductor integrated circuit device according to claim 1,
    wherein each of said wafers has a diameter of 280 mm or more.

3. The method of manufacturing a semiconductor integrated circuit device according to claim 1,
    wherein a wafer contact portion of said sealed type semiconductor-accommodating container has a surface resistivity R of $1 \times 10^4 \leq R(\Omega) \leq 1 \times 10^{14}$.

4. The method of manufacturing a semiconductor integrated circuit device according to claim 1,
    wherein a wafer contact portion of said sealed type semiconductor-accommodating container has a surface resistivity R of $1 \times 10^5 \leq R(\Omega) \leq 1 \times 10^{13}$.

5. The method of manufacturing a semiconductor integrated circuit device according to claim 1,
    wherein a wafer contact portion of said sealed type semiconductor-accommodating container has a surface resistivity R of $1 \times 10^6 \leq R(\Omega) \leq 1 \times 10^9$.

6. The method of manufacturing a semiconductor integrated circuit device according to claim 1,
    wherein said static charge elimination is performed by an ionizer.

7. The method of manufacturing a semiconductor integrated circuit device according to claim 1,
    wherein a wafer contact portion of said transport mechanism is static-charge-eliminated in said static elimination of said treated wafers.

8. The method of manufacturing a semiconductor integrated circuit device according to claim 1,
    wherein a structure which effectuates said eliminating of static charge of said treated wafers is disposed in said local clean chamber.

9. The method of manufacturing a semiconductor integrated circuit device according to claim 8,
wherein said structure which effectuates said eliminating of static charge is an ionizer disposed in said local clean chamber.

10. The method of manufacturing a semiconductor integrated circuit device according to claim 1,
wherein said eliminating static charge eliminates static charge of treated wafers in said sealed type semiconductor-accommodating container linked to said local clean chamber.

11. The method of manufacturing a semiconductor integrated circuit device according to claim 10,
wherein said eliminating static charge also eliminates static charge of wafers in said load lock and unload lock mechanism.

12. The method of manufacturing a semiconductor integrated circuit device according to claim 1,
wherein a wafer contact portion of said transport mechanism is nonconductive.

13. The method of manufacturing a semiconductor integrated circuit device according to claim 12,
wherein said wafer contact portion of said transport mechanism is of a nonconductive resin.

14. The method of manufacturing a semiconductor integrated circuit device according to claim 1,
wherein said eliminating static charge eliminates static charge on treated wafers passing through said local clean chamber.

* * * * *